(12) United States Patent
Shen et al.

(10) Patent No.: US 9,972,584 B2
(45) Date of Patent: May 15, 2018

(54) CHIP PACKAGE AND MANUFACTURING METHOD THEREOF

(71) Applicant: XINTEC INC., Taoyuan (TW)

(72) Inventors: Hsing-Lung Shen, Hsinchu (TW); Jiun-Yen Lai, Taipei (TW); Yu-Ting Huang, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days. days.

(21) Appl. No.: 15/140,199

(22) Filed: Apr. 27, 2016

(65) Prior Publication Data

US 2016/0322312 A1    Nov. 3, 2016

Related U.S. Application Data

(60) Provisional application No. 62/155,482, filed on May 1, 2015.

(51) Int. Cl.
| | |
|---|---|
| *H01L 23/00* | (2006.01) |
| *H01L 21/66* | (2006.01) |
| *H01L 21/768* | (2006.01) |
| *H01L 23/31* | (2006.01) |
| *H01L 31/0203* | (2014.01) |

(Continued)

(52) U.S. Cl.
CPC ...... *H01L 23/564* (2013.01); *H01L 21/76898* (2013.01); *H01L 21/78* (2013.01); *H01L 22/32* (2013.01); *H01L 22/34* (2013.01); *H01L 23/315* (2013.01); *H01L 23/3114* (2013.01); *H01L 23/3128* (2013.01); *H01L 23/3178* (2013.01); *H01L 23/3185* (2013.01); *H01L 31/0203* (2013.01); *H01L 31/02164* (2013.01); *H01L 33/62* (2013.01); *H01L 21/561* (2013.01); *H01L 23/481* (2013.01); *H01L 2224/11* (2013.01)

(58) Field of Classification Search
CPC ............ H01L 21/561; H01L 21/76898; H01L 2224/11; H01L 22/34; H01L 23/3114; H01L 23/481; H01L 23/564; H01L 31/02164; H01L 23/3178; H01L 23/3185; H01L 23/10315; H01L 23/3128; H01L 23/62; H01L 21/78; H01L 22/32; H01L 2224/0401; H01L 24/11; H01L 24/13
See application file for complete search history.

(56) References Cited

U.S. PATENT DOCUMENTS

| | | | | |
|---|---|---|---|---|
| 4,739,178 A | * | 4/1988 | Nobue | ............... H01L 27/14623 250/208.1 |
| 6,893,576 B1 | * | 5/2005 | Nakayama | ............ G03F 7/0035 174/263 |

(Continued)

FOREIGN PATENT DOCUMENTS

| | | |
|---|---|---|
| CN | 102270618 | 12/2011 |
| CN | 103681537 | 3/2014 |

*Primary Examiner* — Sophia Nguyen
(74) *Attorney, Agent, or Firm* — Liu & Liu

(57) ABSTRACT

A chip package includes a chip, a dam layer, a carrier substrate and a light shielding passivation layer. The chip has a first surface and a second surface opposite to the first surface, and a side surface is disposed between the first surface and the second surface. The dam layer is disposed on the first surface, and the carrier substrate is disposed on the dam layer. The light shielding passivation layer is disposed under the second surface and extended into the carrier substrate to cover the side surface of the chip.

16 Claims, 27 Drawing Sheets

(51) Int. Cl.
  *H01L 21/78*     (2006.01)
  *H01L 31/0216*   (2014.01)
  *H01L 33/62*     (2010.01)
  *H01L 23/48*     (2006.01)
  *H01L 21/56*     (2006.01)

(56) References Cited

U.S. PATENT DOCUMENTS

| | | | | |
|---|---|---|---|---|
| 8,013,333 B2* | 9/2011 | Chen | | H01L 22/34 257/48 |
| 8,952,519 B2* | 2/2015 | Lin | | H01L 21/481 257/692 |
| 9,136,291 B2* | 9/2015 | Saito | | H01L 21/76898 |
| 9,177,905 B2* | 11/2015 | Huang | | H01L 23/481 |
| 9,570,633 B2* | 2/2017 | Liu | | H01L 31/0203 |
| 9,728,474 B1* | 8/2017 | Yi | | H01L 22/32 |
| 2001/0028611 A1* | 10/2001 | Shibano | | G02B 27/283 369/44.14 |
| 2004/0214380 A1* | 10/2004 | Leib | | B81C 1/00301 438/151 |
| 2005/0077458 A1* | 4/2005 | Ma | | H01L 27/14618 250/239 |
| 2005/0248011 A1* | 11/2005 | Jung | | H01L 22/32 257/678 |
| 2007/0262381 A1* | 11/2007 | Kojima | | B81B 7/007 257/347 |
| 2007/0267647 A1* | 11/2007 | Lee | | H01L 21/76898 257/99 |
| 2009/0050995 A1* | 2/2009 | Liu | | H01L 23/3114 257/434 |
| 2009/0050996 A1* | 2/2009 | Liu | | H01L 23/3114 257/434 |
| 2009/0231477 A1* | 9/2009 | Igarashi | | H01L 27/14618 348/294 |
| 2009/0283311 A1* | 11/2009 | Ida | | H01L 23/481 174/260 |
| 2009/0289318 A1* | 11/2009 | Lin | | H01L 27/14618 257/433 |
| 2009/0294779 A1* | 12/2009 | Ida | | H01L 27/14618 257/82 |
| 2010/0102460 A1* | 4/2010 | Tomita | | H01L 21/6835 257/786 |
| 2010/0117175 A1* | 5/2010 | Shizuno | | H01L 27/14618 257/432 |
| 2010/0117176 A1* | 5/2010 | Uekawa | | H01L 27/14618 257/432 |
| 2010/0132075 A1* | 5/2010 | Iyoki | | B82Y 35/00 850/6 |
| 2010/0171189 A1* | 7/2010 | Liu | | B81C 1/00301 257/417 |
| 2010/0264503 A1 | 10/2010 | Inoue et al. | | |
| 2011/0042781 A1* | 2/2011 | Liu | | H01L 23/3128 257/507 |
| 2011/0049728 A1* | 3/2011 | Pagani | | H01L 22/32 257/773 |
| 2011/0079903 A1* | 4/2011 | Liu | | H01L 24/03 257/738 |
| 2011/0121503 A1* | 5/2011 | Burrows | | C23C 16/4412 269/289 R |
| 2011/0169139 A1* | 7/2011 | Lin | | H01L 23/481 257/621 |
| 2011/0169159 A1 | 7/2011 | Lin et al. | | |
| 2011/0175221 A1* | 7/2011 | Ni | | B81B 7/0051 257/737 |
| 2011/0193210 A1* | 8/2011 | Chien | | H01L 27/14618 257/684 |
| 2011/0193241 A1* | 8/2011 | Yen | | H01L 21/76898 257/774 |
| 2011/0210413 A1* | 9/2011 | Huang | | H01L 23/3171 257/433 |
| 2011/0221070 A1* | 9/2011 | Yen | | H01L 23/481 257/774 |
| 2011/0278734 A1* | 11/2011 | Yen | | B81B 7/007 257/774 |
| 2011/0278735 A1* | 11/2011 | Yen | | B81B 7/007 257/774 |
| 2011/0298000 A1* | 12/2011 | Liu | | H01L 23/481 257/99 |
| 2012/0043691 A1* | 2/2012 | Uekido | | C08J 7/047 264/173.16 |
| 2012/0112329 A1* | 5/2012 | Yen | | H01L 23/3171 257/666 |
| 2012/0133381 A1* | 5/2012 | Bruland | | H01L 22/32 324/754.03 |
| 2012/0161265 A1* | 6/2012 | Hora | | G01T 1/167 257/429 |
| 2012/0205799 A1* | 8/2012 | Lin | | H01L 21/76898 257/737 |
| 2012/0228752 A1* | 9/2012 | Huang | | H01L 23/3114 257/660 |
| 2013/0020700 A1* | 1/2013 | Liu | | H01L 23/16 257/737 |
| 2013/0084664 A1* | 4/2013 | Yoshitoku | | H01L 27/3211 438/34 |
| 2013/0119524 A1* | 5/2013 | Chan | | H01L 21/6835 257/668 |
| 2013/0119556 A1* | 5/2013 | Liu | | H01L 23/481 257/774 |
| 2013/0120699 A1* | 5/2013 | Ichihara | | H01L 23/552 349/110 |
| 2013/0130444 A1* | 5/2013 | Liu | | H01L 23/3128 438/113 |
| 2013/0161778 A1* | 6/2013 | Lin | | H01L 27/14683 257/460 |
| 2013/0175528 A1* | 7/2013 | Han | | H01L 22/32 257/48 |
| 2013/0188267 A1* | 7/2013 | Oganesian | | H01L 27/14618 359/718 |
| 2013/0273254 A1* | 10/2013 | Hsu | | C08K 3/04 427/379 |
| 2013/0307147 A1* | 11/2013 | Liu | | H01L 21/76898 257/737 |
| 2013/0328147 A1* | 12/2013 | Ho | | H01L 31/02002 257/432 |
| 2014/0084458 A1* | 3/2014 | Huang | | H01L 23/481 257/737 |
| 2014/0203387 A1* | 7/2014 | Suen | | H01L 31/02005 257/431 |
| 2014/0203416 A1* | 7/2014 | Huang | | H01L 23/3114 257/659 |
| 2014/0266568 A1* | 9/2014 | Cheng | | G01R 1/203 338/314 |
| 2014/0267985 A1* | 9/2014 | Sato | | G02F 1/133512 349/106 |
| 2014/0312482 A1* | 10/2014 | Chang | | H01L 24/26 257/690 |
| 2014/0319670 A1* | 10/2014 | Chien | | H01L 27/14618 257/690 |
| 2015/0009422 A1* | 1/2015 | Tung | | G06F 3/044 349/12 |
| 2015/0018447 A1* | 1/2015 | Son | | C08G 59/24 522/71 |
| 2015/0030816 A1* | 1/2015 | Uemura | | C03C 21/00 428/192 |
| 2015/0041995 A1* | 2/2015 | Lin | | H01L 21/76898 257/782 |
| 2015/0062922 A1* | 3/2015 | Huang | | G02B 19/0066 362/311.02 |
| 2015/0099357 A1* | 4/2015 | Shiu | | H01L 21/6835 438/613 |
| 2015/0123231 A1* | 5/2015 | Chien | | H01L 24/05 257/432 |
| 2015/0130007 A1* | 5/2015 | Kawamura | | H01L 27/14623 257/432 |
| 2015/0132949 A1* | 5/2015 | Lin | | H01L 21/481 438/667 |
| 2015/0137341 A1* | 5/2015 | Liu | | H01L 23/5386 257/692 |

(56) References Cited

U.S. PATENT DOCUMENTS

| | | | |
|---|---|---|---|
| 2015/0145094 A1* | 5/2015 | Liu | H01L 25/50 257/459 |
| 2015/0287659 A1* | 10/2015 | Liu | H01L 23/3114 257/737 |
| 2015/0329351 A1* | 11/2015 | Cheng | B81C 1/00238 257/417 |
| 2016/0062230 A1* | 3/2016 | Wu | G03F 1/68 428/195.1 |
| 2016/0141219 A1* | 5/2016 | Liu | G01L 19/14 257/737 |
| 2016/0195749 A1* | 7/2016 | Um | G02F 1/13394 349/110 |
| 2016/0218129 A1* | 7/2016 | Liu | H01L 27/14618 |
| 2016/0240520 A1* | 8/2016 | Ho | H01L 25/16 |
| 2016/0246139 A1* | 8/2016 | Li | H01L 29/78678 |
| 2016/0266680 A1* | 9/2016 | Chang | G06F 3/044 |
| 2016/0322312 A1* | 11/2016 | Shen | H01L 23/564 |
| 2016/0343882 A1* | 11/2016 | Kuo | H01L 31/02002 |
| 2016/0355393 A1* | 12/2016 | Liu | B81B 3/0081 |
| 2016/0370892 A1* | 12/2016 | Chang | G06F 3/0416 |
| 2016/0372445 A1* | 12/2016 | Yiu | H01L 25/065 |
| 2017/0025370 A1* | 1/2017 | Chen | H01L 24/06 |
| 2017/0077158 A1* | 3/2017 | Huang | H01L 27/14623 |
| 2017/0098678 A1* | 4/2017 | Lai | H01L 27/14636 |

\* cited by examiner

| Providing a wafer, the wafer having a first surface and a second surface opposite to the first surface and a sensing layer, a first insulation layer, a conductive pad and a test circuit, the sensing layer disposed on the first surface, the first insulation layer disposed underneath the first surface, the conductive pad and test circuit disposed in the first insulation layer and electrically disconnected | ~510 |

| Forming a dam layer on the first surface surrounding the sensing layer, forming a carrier substrate on the dam layer to cover the sensing layer | ~520 |

| Forming a through hole extending from the second surface to the first surface of the wafer to expose the conductive pad | ~530 |

| Forming a second insulation layer underneath the second surface and in the through hole, removing a portion of the second insulation layer in the through hole to expose the conductive pad in the through hole | ~540 |

| Forming a conductive layer underneath the second insulation layer and in the through hole | ~550 |

| Removing a portion of the wafer, a portion of the dam layer and a portion of the carrier substrate to form a chamfered edge to expose a side of the wafer | ~560 |

| Forming a light shielding passivation layer underneath the second surface and on the chamfered edge, the light shielding passivation layer extending to the carrier substrate and covering the side of the wafer | ~570 |

| Forming a second opening in the light shielding passivation layer to expose the conductive layer and forming an external conductive structure in the second opening | ~580 |

| Grinding the carrier substrate to form a first opening and cutting the light shielding passivation layer and the carrier substrate along the chamfered edge to form a chip package | ~590 |

Fig. 5

CHIP PACKAGE AND MANUFACTURING METHOD THEREOF

RELATED APPLICATIONS

This application claims priority to U.S. Provisional Application Ser. No. 62/155,482, filed May 1, 2015, which is herein incorporated by reference.

BACKGROUND

Field of Invention

The present invention relates to a chip package and a method of manufacturing a chip package.

Description of Related Art

Electronic products require multiple functions, while the dimension has to remain compact. The semiconductor chip of the electronic products has ever reducing chip size, and the circuit density increases. The manufacturing of semiconductor chip package is therefore more challenging. Wafer level chip package is one type of semiconductor chip packaging. It refers to a production process when all the packaging process and testing are done to the entire wafer, and then it is cut into single chip package.

In a time when the dimension of semiconductor chip shrinks dramatically, circuit density elevates, insulation property of a chip package plays an important role in chip packaging technique. Insulation is also related moisture, temperature or pressure blocking, which has great impact on the reliability of internal circuit of the chip package. This is usually done by forming a passivation layer to cover the circuit after the circuit layout is finished, and the air is blocked out, and then the wafer is cut into independent chip package. However, the side surface of a chip package will not have any passivation layer. Moisture invades from the side surface results in internal circuit oxidation, or in a worse case, the silicon via of the chip package is crushed, leading to incorrect electrical connection.

SUMMARY

The instant disclosure provides a chip package and a method of manufacturing a chip package to elevate the yield rate and reliability.

One aspect of the instant disclosure provides a chip package. The chip package includes a chip, a dam layer, a carrier substrate and a light shielding passivation layer. The chip has a first surface and a second surface opposite to the first surface, and a side surface is in between the first surface and the second surface. The dam layer is disposed on the first surface, and the carrier substrate is disposed on the dam layer. The light shielding passivation layer is disposed under the second surface and extends into the carrier substrate to cover the side surface of the chip.

According to some embodiments of the instant disclosure, a material of the light shielding passivation layer includes epoxy resin or a low light permeability material.

According to some embodiments of the instant disclosure, the chip includes a sensing layer, a first insulation layer, an conductive pad area, a test circuit and a through hole. The sensing layer is disposed on the first surface, and the dam layer surrounds the sensing layer. The first insulation layer is disposed underneath the first surface. The conductive pad area and the test circuit are disposed in the first insulation layer, and the conductive pad area and the test circuit are electrically disconnected. The through hole extends from the second surface towards the first surface of the chip to expose the conductive pad area.

According to some embodiments of the instant disclosure, the test circuit is exposed on the side surface of the chip, and the light shielding passivation layer covers the test circuit.

According to some embodiments of the instant disclosure, the first insulation layer is exposed on the side surface of the chip, and the light shielding passivation layer covers the first insulation layer.

According to some embodiments of the instant disclosure, the carrier substrate is formed with a first opening on the sensing layer.

According to some embodiments of the instant disclosure, a second insulation layer is disposed underneath the second surface and extends into the through hole, covering sidewalls of the through hole. A conductive layer is disposed in between the second insulation layer and the light shielding passivation layer and extending into the through hole and in contact with the area of the conductive pads.

According to some embodiments of the instant disclosure, a material of the first insulation layer and the second insulation layer includes silicon oxide, silicon nitride, silicon oxynitride or a combination thereof.

According to some embodiments of the instant disclosure, the second insulation extends and covers the side surface and is in between the side surface of the chip and the light shielding passivation layer.

According to some embodiments of the instant disclosure, the light shielding passivation layer is formed with a second opening to expose a portion of the conductive layer.

According to some embodiments of the instant disclosure, an external conductive structure is disposed in the second opening and in contact with the conductive layer.

Another aspect of the instant disclosure provides a method of manufacturing a chip package. The method includes providing a wafer. The wafer has a first surface and a second surface opposite to the first surface. Then a dam layer is formed on the first surface. Next a carrier layer is formed on the dam layer. A portion of the wafer, a portion of the dam layer and a portion of the carrier substrate are removed to form a notch to expose a side surface of the wafer. Subsequently, a light shielding passivation layer is formed underneath the second surface and in the notch. The light shielding passivation layer extends to the carrier substrate and covers the side surface of the wafer.

According to some embodiments of the instant disclosure, the second surface of the wafer is ground.

According to some embodiments of the instant disclosure, the wafer includes a sensing layer, a first insulation layer, a conductive pad area and a test circuit. The sensing layer is disposed on the first surface, and the dam layer surrounds the sensing layer. The first insulation layer is disposed underneath the first surface. The conductive pad area and the test circuit are disposed in the first insulation layer, and the conductive pad area and the test circuit are electrically disconnected.

According to some embodiments of the instant disclosure, the test circuit is exposed on the side surface of the wafer, and the light shielding passivation layer in the notch covers the test circuit.

According to some embodiments of the instant disclosure, a through hole is formed and extending from the second surface to the first surface of the wafer to expose the conductive pad. Next a second insulation layer is formed underneath the second surface and in the through hole. Subsequently, a portion of the second insulation layer is removed in the through hole to expose the conductive pad area in the through hole. Then a conductive layer is formed underneath the second insulation layer and in the through hole. The light shielding passivation layer covers the conductive layer.

According to some embodiments of the instant disclosure, the light shielding passivation layer is patterned to form a second opening that exposes the conductive layer. An external conductive structure is formed in the second opening.

According to some embodiments of the instant disclosure, the carrier substrate is ground to form a first opening.

According to some embodiments of the instant disclosure, the light shielding passivation layer is cut along the notch to form a chip package.

According to some embodiments of the instant disclosure, the light shielding passivation layer is formed by spreading, deposition or printing.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 5 is a block diagram illustrating a method of manufacturing a chip package in accordance with an embodiment of the instant disclosure;

DETAILED DESCRIPTION

Figure 1:
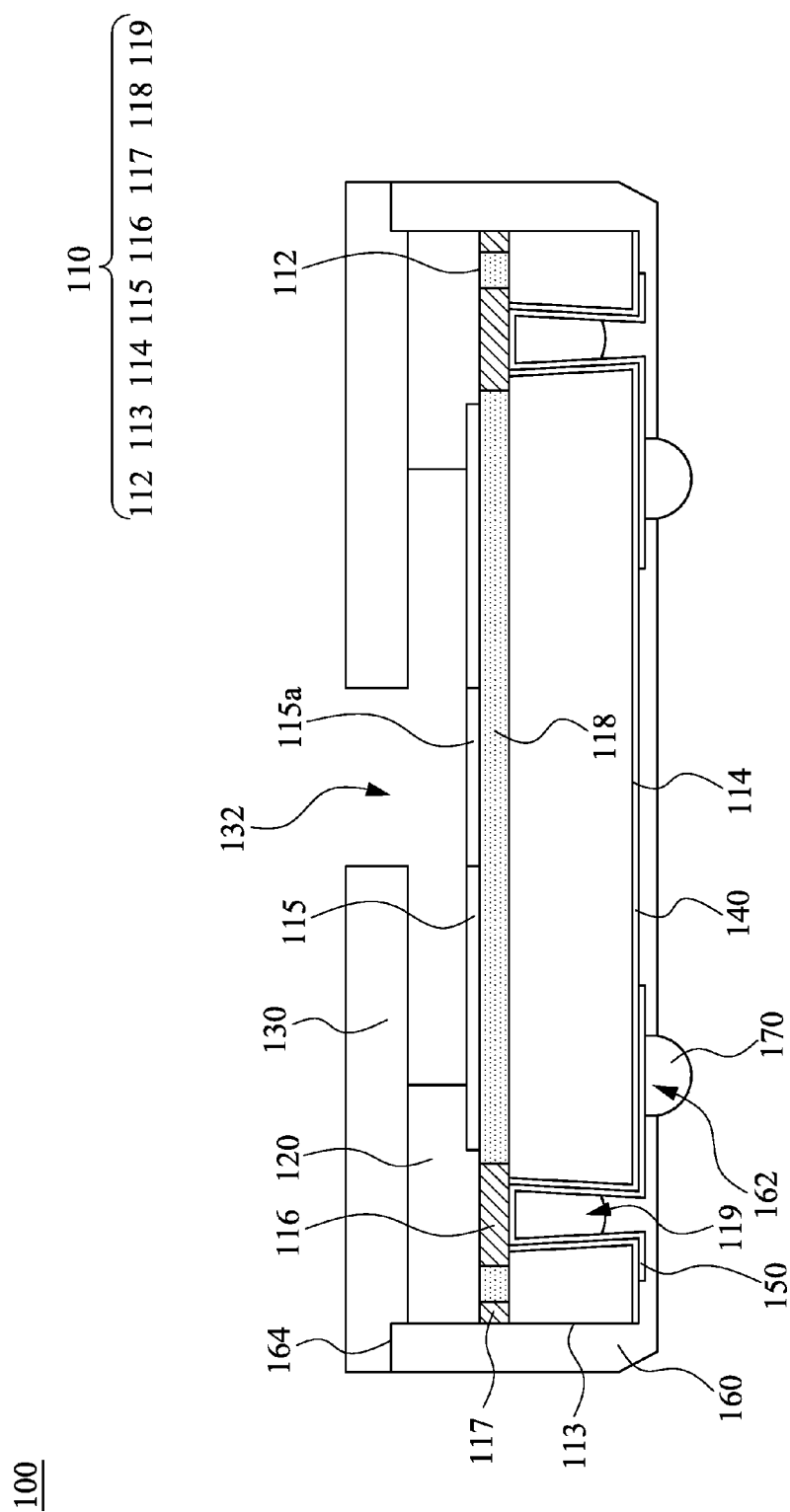
FIG. 1 is a cross-sectional view illustrating a chip package in accordance with an embodiment of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a chip package 100 in accordance with an embodiment of the instant disclosure. As shown in FIG. 1, the chip package 100 includes a chip 110, a dam layer 120, a carrier substrate 130, a second insulation layer 140, a conductive layer 150, a light shielding passivation layer 160 and an external conductive structure 170. The chip 110 has a first surface 112 and a second surface 114 opposite to the first surface 112 and a side surface 113 in between the first surface 112 and the second surface 114. The dam layer 120 is disposed on the first surface 112. The carrier substrate 130 is disposed on the dam layer 120. The light shielding passivation layer 160 is disposed underneath the second surface 114 and extends to the carrier substrate 130 and covers the side surface 113. In other words, the light shielding passivation layer 160 covers the second surface 114 of the chip 110 and extends to the side of the chip package 100 so as to cover the side surface 113 of the chip 110, the side of the dam layer 120 and the carrier substrate 130. It should be noted that a portion of the light shielding passivation layer 160 are inserted into the carrier substrate 130, such that an interface 164 between the light shielding passivation layer 160 and the carrier substrate 130 has a stepped contour. However, the instant disclosure is not limited thereto. In some embodiments of the instant disclosure, the interface 164 may be smooth curve or any other suitable geometrical configuration.

More specifically, the chip 110 includes a conductive pad area 116, a test circuit 117 and a first insulation layer 118. The first insulation layer 118 is disposed underneath the first surface 112. The conductive pad area 116 and the test circuit 117 are disposed in the first insulation layer 118 and electrically disconnected. The test circuit 117 refers to the metal layer for testing in the earlier stage of manufacturing, and the test circuit 117 does not have functionality in the chip package 100. However, after the chip package 100 is cut to be independent, the test circuit 117 will be exposed on the side surface 113 of the chip 100 and in direct contact with the air. The moisture in the air leads to oxidation swelling of the test circuit 117, and the high pressure compresses the internal circuit, for example the conductive layer 150 in a through hole 119 of the chip package 100. This phenomenon results in low yielding rate. In order to avoid such defect, the light shielding passivation layer 160 on the second surface 114 extends to the side surface 113 of the chip 110 and covers the exposed test circuit 117, such that moisture is prevented from invading the test circuit 117. In addition, the interface between the dam layer 120 and the chip 110 may easily come apart because of moisture. The light shielding passivation layer 160 covers the side of the dam layer 120 such that the dam layer 120 does not easily intake moisture. In some embodiments of the instant disclosure, the chip 110 does not have test circuit 117, and the first insulation layer 118 is exposed on the side surface 113 of the chip 110. The first insulation layer 118 also absorbs moisture, and pressure is created to compress the internal circuit. The light shielding passivation layer 160 extends to the side surface 113 of the chip 110 and covers the first insulation layer 118 so as to prevent moisture invasion to the first insulation layer 118.

In some embodiments of the instant disclosure, chip 110 includes semiconductor elements, inter-layered dielectric layer, inter-metal dielectric layer, passivation layer and interconnection metal structure. It should be noted that the conductive pad area 116 and the test circuit 117 are the interconnection metal structure. They have a plurality of metal layers in parallel and vias connected in between. A portion of the first insulation layer 118 is disposed in between the metal layers, acting as inter-metal dielectric layer. Vias may go through the first insulation layer 118 to electrically connect adjacent metal layers. Furthermore, the first insulation layer 118 allows electrical insulation between the conductive pad area 116 and the test circuit 117. In some embodiments of the instant disclosure, a material of the first insulation layer 118 includes silicon oxide, silicon nitride or any other suitable insulation material. A material of the light shielding passivation layer 160 includes epoxy resin or low light permeability material. In some embodiments of the instant disclosure, the carrier substrate 130 is blank silicon substrate.

The chip 110 includes a sensing layer 115 disposed on the first surface 112 of the chip 110. The dam layer 120 surrounds the sensing layer 115, and the sensing layer 115 is electrically connected to the conductive pad area 116. The dam layer 120 may span across to the sensing layer 115 as shown in FIG. 1, but the instant disclosure is not limited thereto. The dam layer 120 may also retain a distance between the sensing layer 115. The sensing layer 115 is a humidity sensing layer, light sensing layer or pressure sensing layer. In an embodiment of the instant disclosure, the sensing layer 115 is a humidity sensing layer that includes humidity sensing polymer. The carrier substrate 130 is formed with a first opening 132 on the sensing layer 115, and a top down projection of the first opening 132 overlaps a sensing area 115a of the sensing layer 115. Moisture enters from the first opening 132 changes the property (e.g., resistance, capacitance) of the humidity sensing polymer in the sensing area 115a. The sensing area 115a transmits signals to the chip 110 for humidity conversion. The light shielding passivation layer 160 of the instant disclosure protects the test circuit 117 and blocks external energy from entering the carrier substrate 130. For example, a light beam enters the carrier substrate 130 has a certain energy and spreads to a direction towards the sensing layer 115, leading to data variation that is detected by the sensing area 115a (especially when the sensing layer 115 is a light sensing layer or humidity sensing layer). Therefore, the light shielding passivation layer 160 extends to the carrier substrate 130 to block most of light attacking from the side of the carrier substrate 130, and the sensing precision can be greatly elevated.

The chip 110 is formed with a through hole 119 extending from the second surface 114 towards the first surface 112 and exposing the conductive pad area 116. The second insulation layer 140 is disposed underneath the second surface 114 and extends to the through hole 119 to cover the sidewalls of the through hole 119. The conductive layer 150 is disposed in between the second insulation layer 140 and the light shielding passivation layer 160 and extends to the through hole 119 so as to be in contact with the conductive pad area 116. More specifically, the conductive layer 150 is in contact with the metal layer of the conductive pad area 116. In some embodiments of the instant disclosure, a material of the conductive layer 150 includes aluminium, copper, nickel or any other suitable conductive material. A material of the second insulation layer 140 includes silicon oxide, silicon nitride or any other suitable insulation material. The light shielding passivation layer 160 is formed with a second opening 162 that exposes a portion of the conductive layer 150. An external conductive structure 170 is disposed in the second opening 162 and in contact with the conductive layer 150. As a result, the external conductive structure 170 is electrically connected to the conductive pad area 116 through the conductive layer 150, such that humidity data that are calculated by the chip 110 can be transmitted to external device, for example, printed circuit board. The external conductive structure 170 may be soldering ball, bump or any other suitable conductive structure, and the shape of the external conductive structure may be round, oval, square, rectangle or any other suitable configuration.

Figure 2:
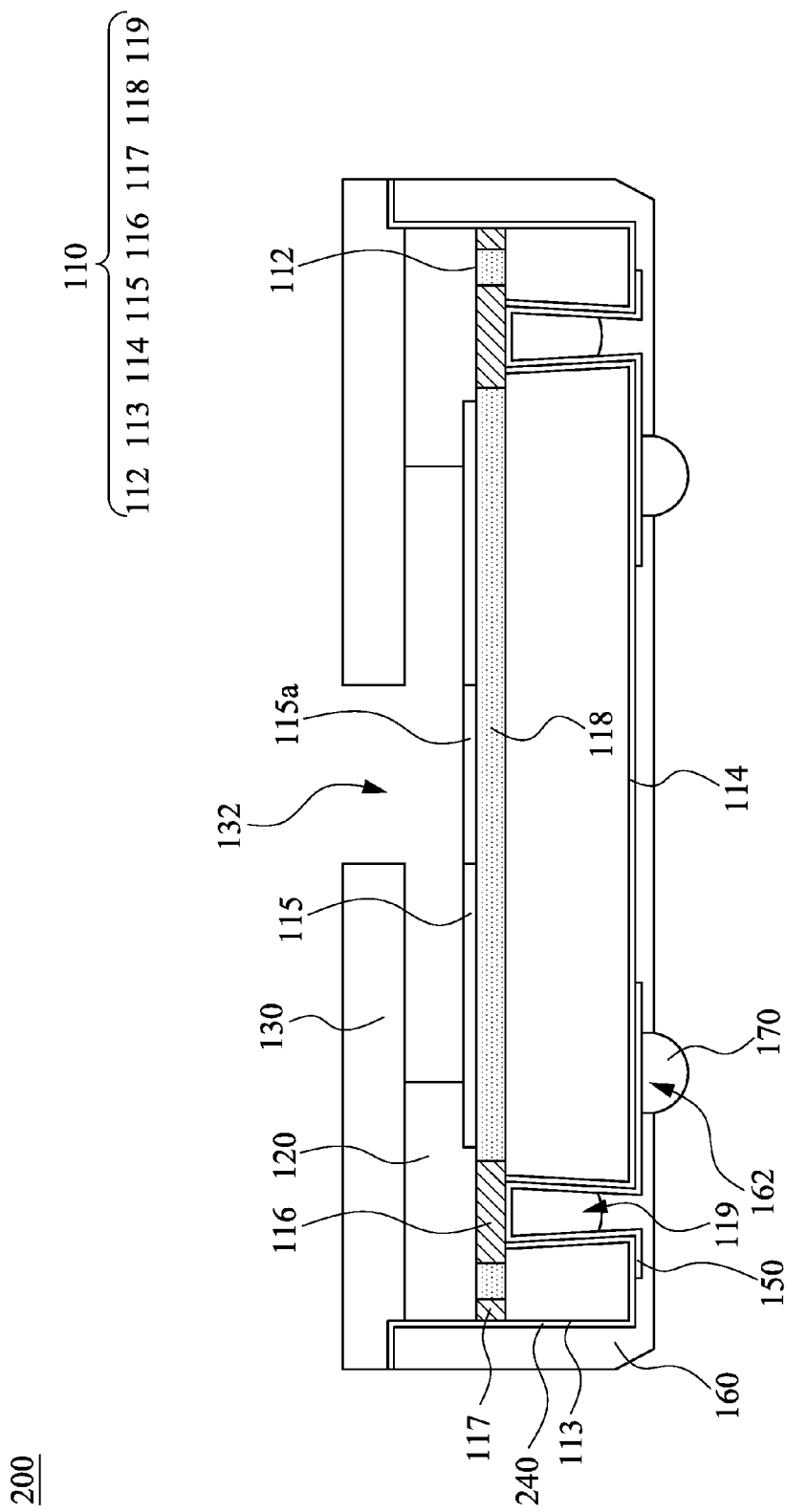
FIG. 2 is a cross-sectional view illustrating a chip package in accordance with an embodiment of the instant disclosure.

Please refer to FIG. 2. FIG. 2 is a cross-sectional view illustrating a chip package in accordance with an embodiment of the instant disclosure. It should be understood that similar elements are not repeatedly described hereinafter. The difference between the chip package 200 shown in FIG. 2 and the chip package 100 shown in FIG. 1 arises from the second insulation layer 240. The second insulation layer 240 of the chip package 200 is disposed underneath the second surface 114 and extends to the carrier substrate 130 and covers the side surface 113 of the chip 110 and the side of the dam layer 120. As shown in FIG. 2, the second insulation layer 240 is sandwiched in between the side surface 113 of the chip 110 and the light shielding passivation layer 160 and covers the test circuit 117 on the side surface 113. More specifically, the second insulation layer 240 and the light shielding passivation layer 160 are disposed on either side of the chip package 200 so as to block moisture contact with the test circuit 117 from the side surface 113. The yield rate of the chip package is greatly elevated.

Figure 3:
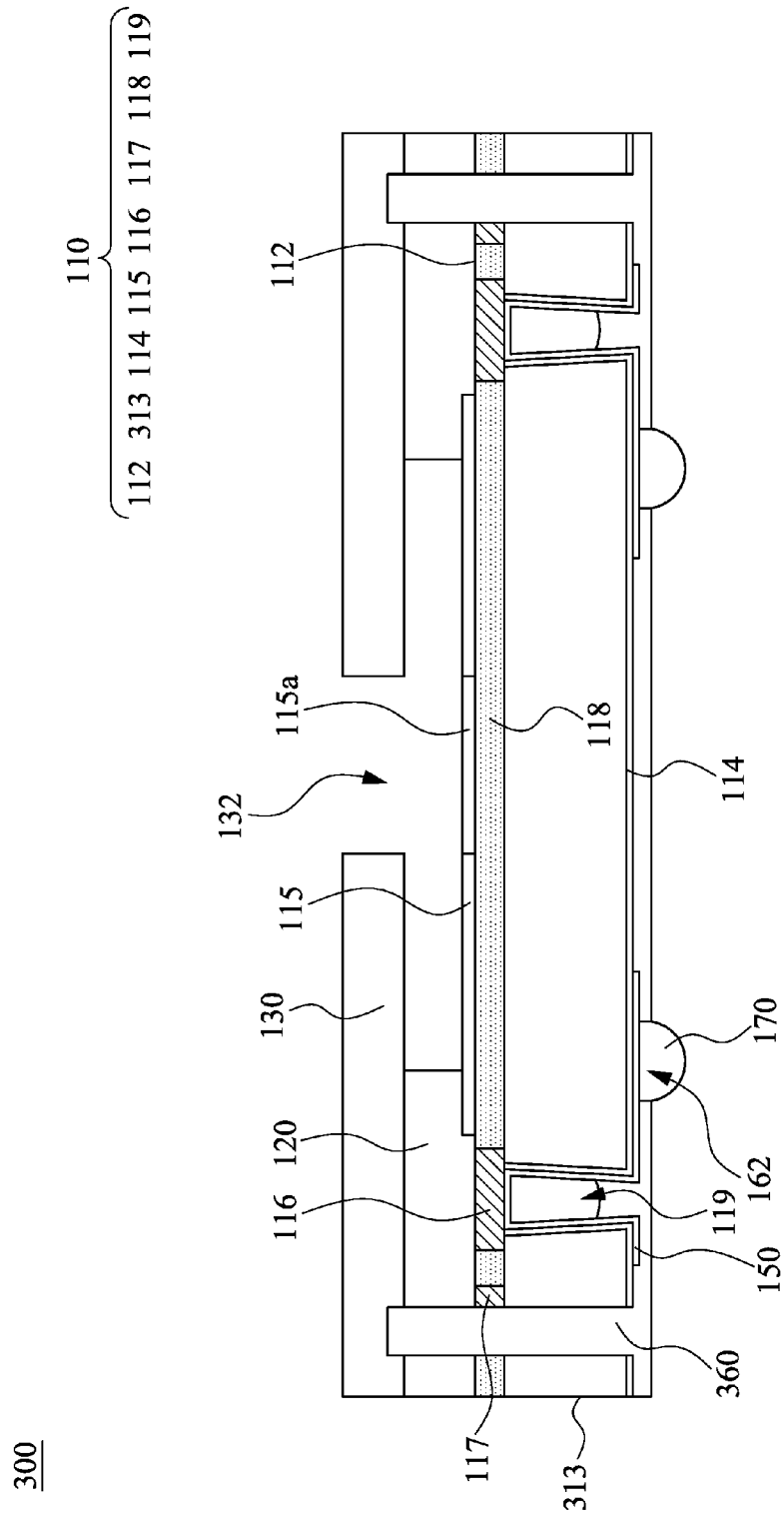
FIG. 3 is a cross-sectional view illustrating a chip package in accordance with an embodiment of the instant disclosure.

Please refer to FIG. 3. FIG. 3 is a cross-sectional view illustrating a chip package in accordance with an embodiment of the instant disclosure. It should be understood that similar elements are not repeatedly described hereinafter. The difference between the chip package 300 shown in FIG. 3 and the chip package 100 shown in FIG. 1 arises from the light shielding passivation layer 360. The light shielding passivation layer 360 of the chip package 300 is disposed underneath the second surface 114 and extends to the chip 110, dam layer 120 and a portion of the carrier substrate 130 so as to cover the test circuit 117 of the chip 110. However, the light shielding passivation layer 360 does not cover either side of the chip package 300, and therefore the side surfaces 313 of the chip 110 and the dam layer 120 are exposed to the air. Although moisture enters from the side surface 313 of the chip 110, the light shielding passivation layer 360 over the chip 110, dam layer 120 and a portion of the carrier substrate 130 still provides sufficient blocking effect, and moisture is less likely to penetrate.

Figure 4:
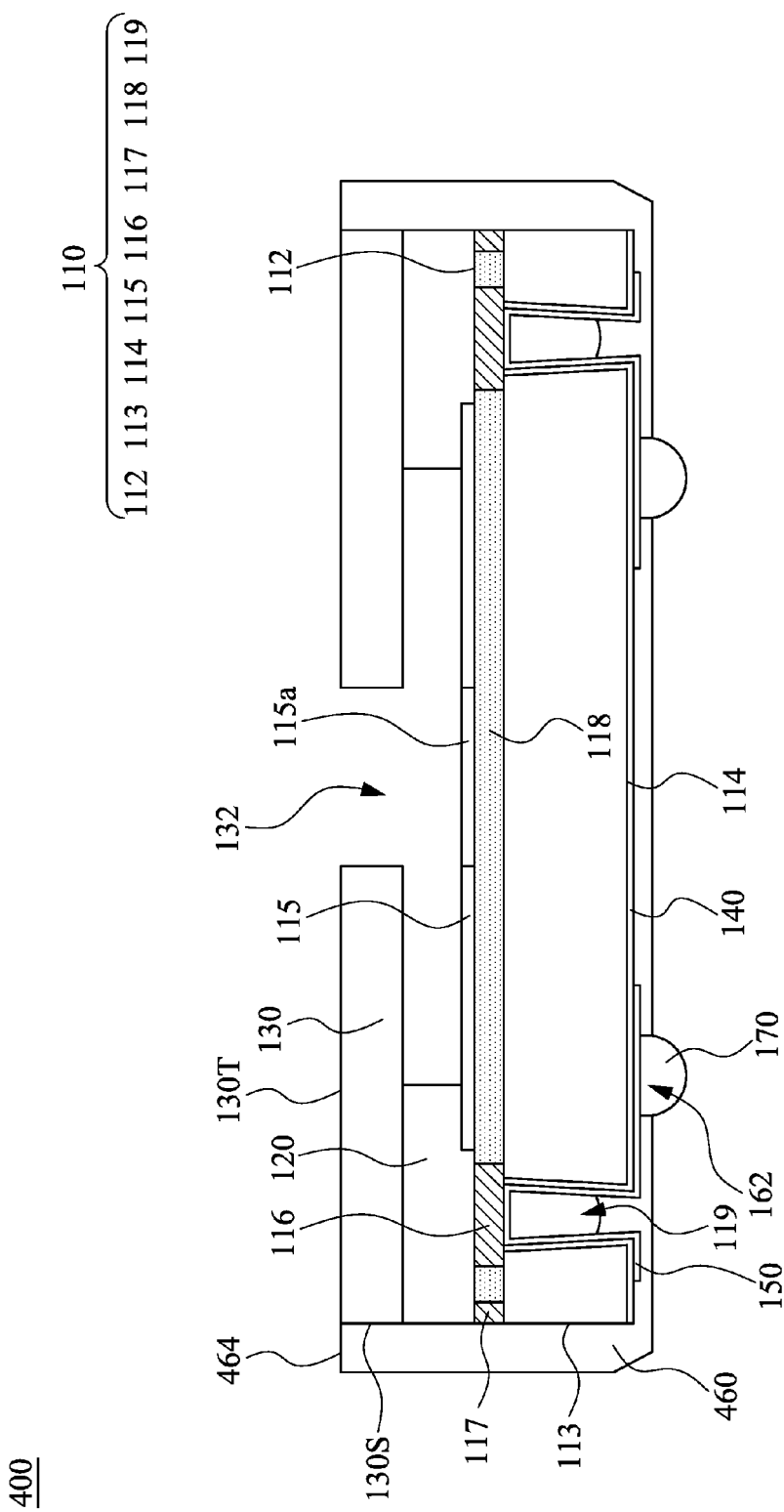
FIG. 4 is a cross-sectional view illustrating a chip package in accordance with an embodiment of the instant disclosure.

Please refer to FIG. 4. FIG. 4 is a cross-sectional view illustrating a chip package in accordance with an embodiment of the instant disclosure. It should be understood that similar elements are not repeatedly described hereinafter. The difference between the chip package 400 shown in FIG. 4 and the chip package 100 shown in FIG. 1 arises from the light shielding passivation layer 460. The light shielding passivation layer 460 of the chip package 400 extends to completely cover the side surface 130S of the carrier substrate 130, and the bottom 462 of the light shielding passivation layer 460 is substantially coplanar with the upper surface 130T of the carrier substrate 130. The light shielding passivation layer 460 shown in FIG. 4 blocks moisture entering the test circuit 117 and completely shield light entry from the side surface 130S of the carrier substrate 130, such that the sensing area 115a will not be interfered, and the chip package detection precision is elevated.

Please refer to FIG. 5. FIG. 5 is a block diagram illustrating a method of manufacturing a chip package in accordance with an embodiment of the instant disclosure. Please refer to FIGS. 6A-6G in conjunction that illustrating the steps of manufacturing the chip package. FIGS. 6A-6G are cross-sectional view illustrating the method of manufacturing the chip package of FIG. 1.

Figure 6A:
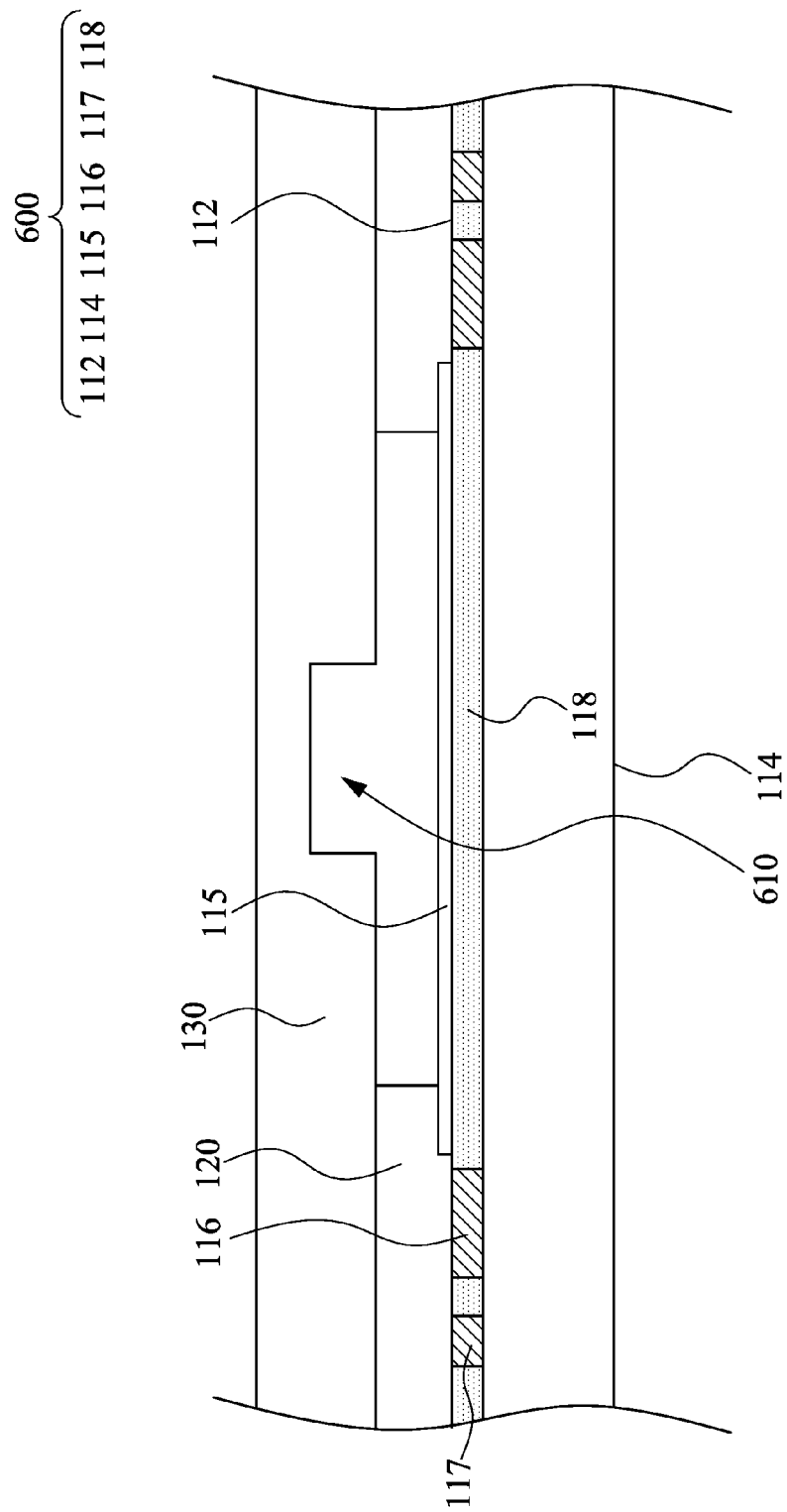
FIGS. 6A-6G are cross-sectional view illustrating the method of manufacturing the chip package of FIG. 1.

Please refer to step 510 in conjunction with FIG. 6A. A wafer 600 is provided. The wafer 600 has a first surface 112 and a second surface 114 opposite to the first surface 112. The wafer 600 has a sensing layer 115, a first insulation layer 118, a conductive pad area 116 and a test circuit 117. The sensing layer 115 is disposed on the first surface 112. The first insulation layer 118 is disposed underneath the first surface 112. The conductive pad area 116 and test circuit 117 are disposed in the first insulation layer 118 and electrically disconnected. The wafer 600 has a plurality of chip areas, and in the subsequent process the chip areas are cut to form a plurality of chip packages 100. In some embodiments of the instant disclosure, the wafer 600 includes semiconductor elements, inter-layered dielectric layer, inter-metal dielectric layer, passivation layer and interconnection metal structure. The conductive pad area 116 and the test circuit 117 are the interconnection metal structure of the wafer 600. They have a plurality of metal layers in parallel and vias connected in between. A portion of the first insulation layer 118 is disposed in between the metal layers, acting as inter-metal dielectric layer. Vias may go through the first insulation layer 118 to electrically connect adjacent metal layers. Furthermore, the first insulation layer 118 allows electrical insulation between the conductive pad area 116 and the test circuit 117.

Please refer to step 520 in conjunction with FIG. 6A. A dam layer 120 is formed on the first surface 112 and surrounds the sensing layer 115. Next, a carrier substrate 120 is formed on the dam layer 120 and covers the sensing layer 115. In this step, an adhesive layer (not shown) is used to combine the sensing layer 115 and the first surface 112. Subsequently, the carrier substrate 130 is attached to the dam layer 120. It should be noted that the carrier substrate 130 is formed with a depression 610 defining the sensing area 115a of the sensing layer 115.

Figure 6B:
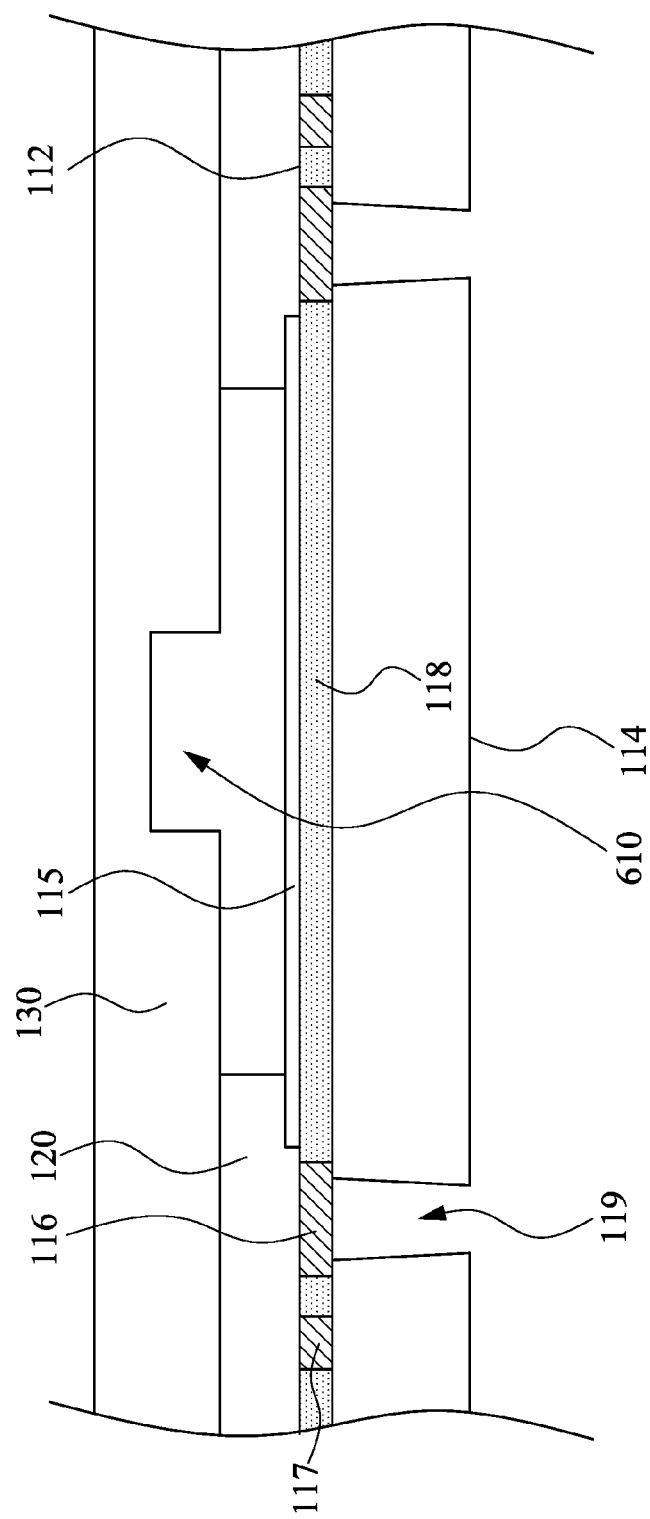

Please refer to step 530 in conjunction with FIG. 6B. A through hole 119 is formed and extending from the second surface 114 to the first surface 112 of the wafer 600 to expose the conductive pad 116. In this step, a portion of the wafer 600 may be removed by photolithography to form the through hole 119 so as to expose the conductive pad area 116. However, the instant disclosure is not limited thereto. In some embodiments of the instant disclosure, before the through hole 119 is formed, the second surface 114 of the wafer 600 is ground so as to reduce the thickness of the wafer 600.

Figure 6C:
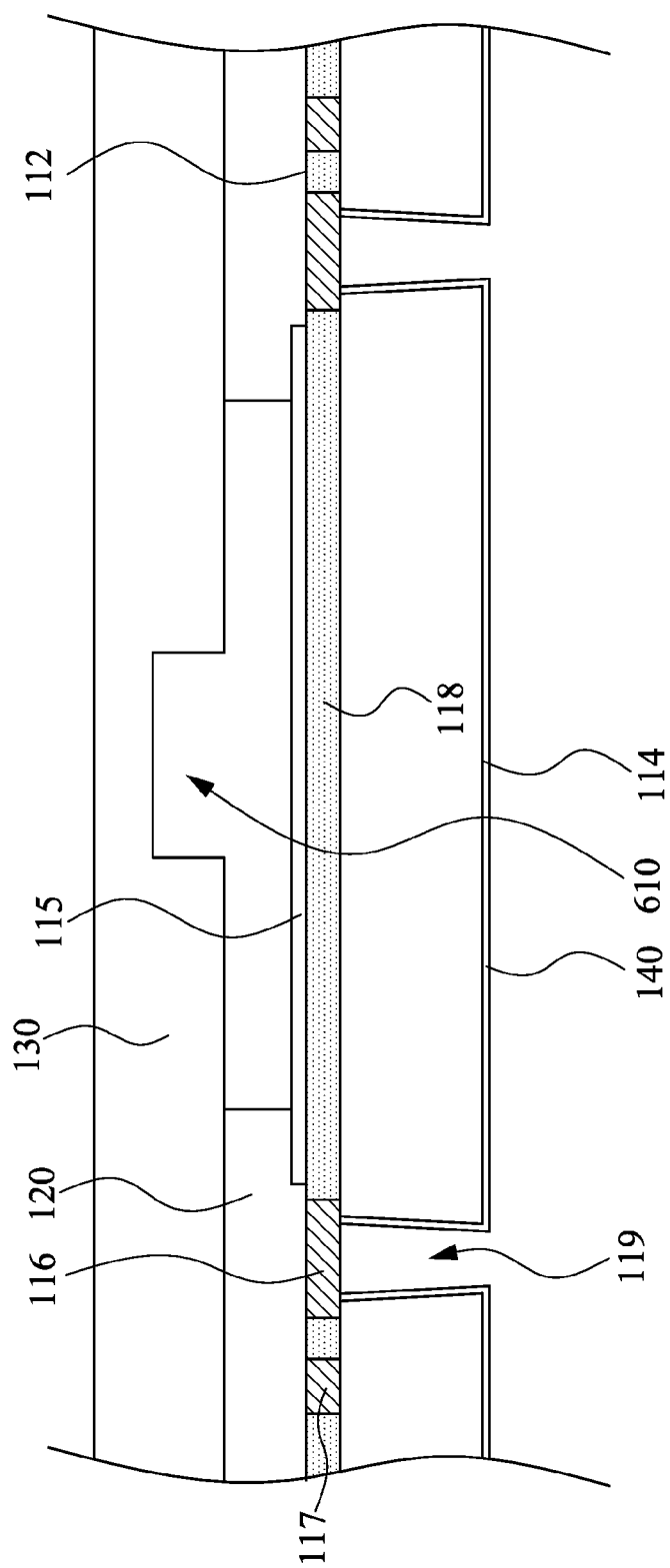

Please refer to step 540 in conjunction with FIG. 6C. A second insulation layer 140 is formed underneath the second surface 114 of the wafer 600 and in the through hole 119. Subsequently, a portion of the second insulation layer 140 is removed from the through hole 119 to expose the conductive pad area 116 in the through hole 119. In this step, chemical vapor deposition (CVD) is used to deposit insulation material underneath the second surface 114 conformingly. A portion of the insulation material enters the through hole 119 and covers the sidewalls and bottom thereof. Then, photolithography may be used to remove the insulation material in the through hole 119 to form the second insulation layer 140, and the conductive pad area 116 is exposed on the bottom of the through hole 119. In some embodiments of the instant disclosure, a material of the second insulation layer 140 includes silicon oxide, silicon nitride or any other suitable insulation material.

Figure 6D:
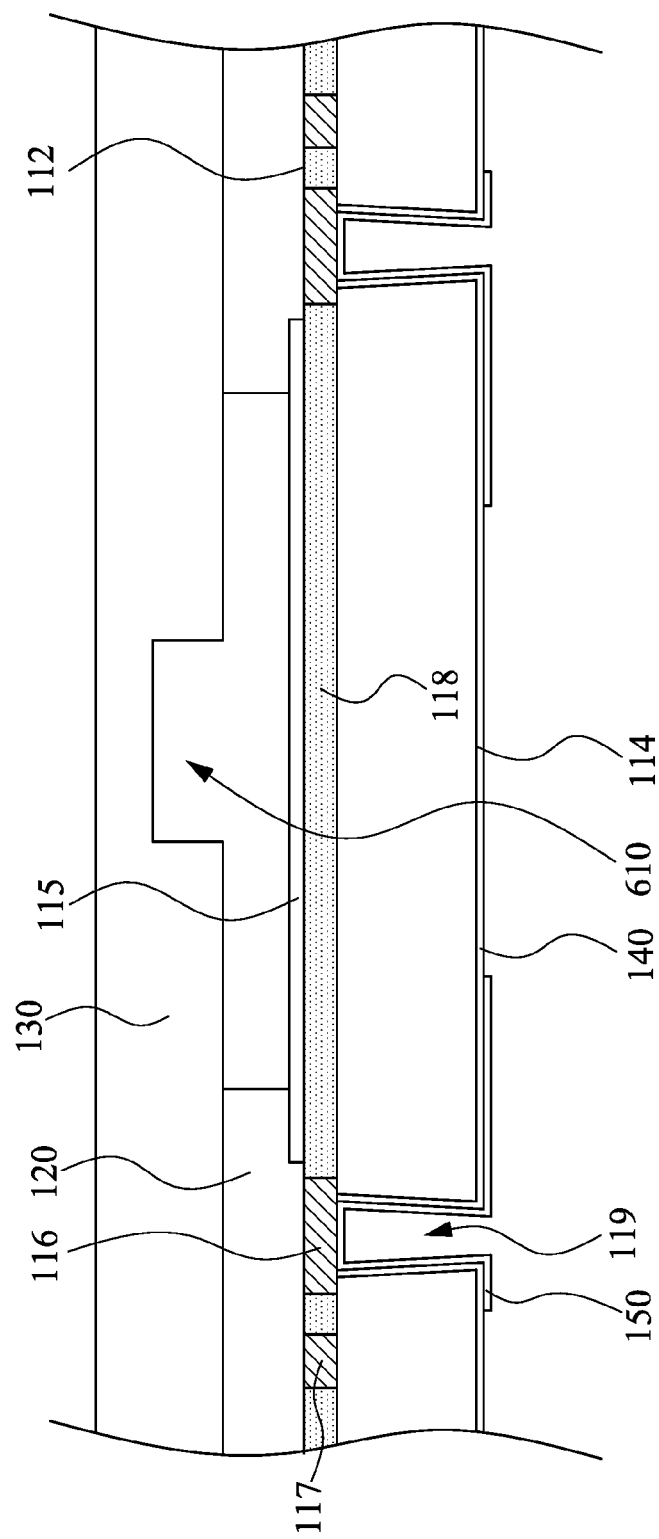

Please refer to FIG. 550 in conjunction with FIG. 6D. A conductive layer 150 is formed underneath the second insulation layer 140 and in the through hole 119. The conductive material may be formed by sputtering, vapor deposition, electroplating, or non-electroplating underneath the second insulation layer 140. A portion of the conductive material extends to the through hole 119 and covers the sidewalls thereof and is in contact with the conductive pad area 116 that is exposed on the bottom of the through hole 119. More specifically, conductive material is in contact with the metal layer in the conductive pad area 116. Afterwards, the conductive material may be patterned by photolithography to form the conductive layer 150. In some embodiments of the instant disclosure, a material of the conductive layer 150 may be, for example, aluminium, copper, nickel or any other suitable conductive material.

Figure 6E:
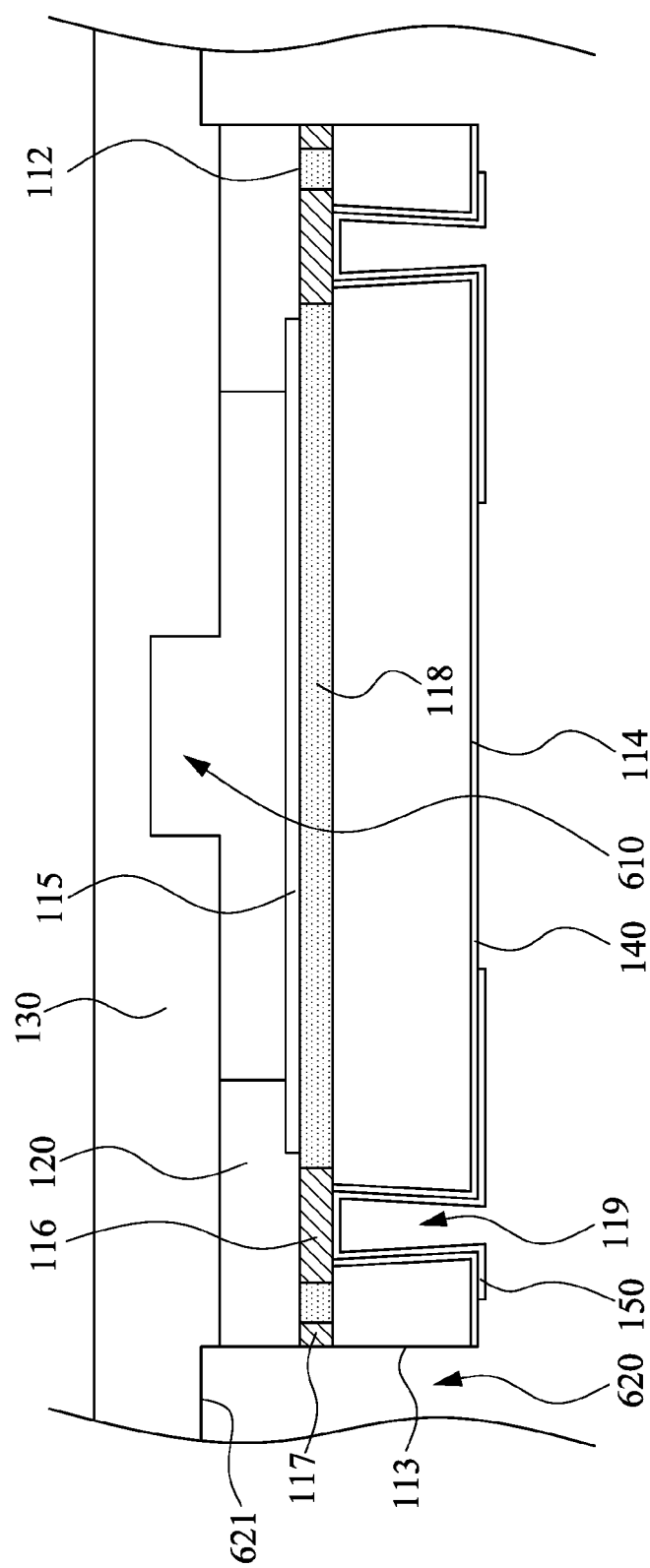

Please refer to step 560 in conjunction with FIG. 6E. A portion of the wafer 600, a portion of the dam layer 120 and a portion of the carrier substrate 130 are removed to form a notch 620 to expose a side surface 113 of the wafer 600. In this step, a cutting tool is used to remove a portion of the wafer 600 to form the side surface 113 in between the first surface 112 and the second surface 114. The test circuit 117 is exposed on the side surface 113 of the wafer 600. It should be noted that this step is a pre-cutting process, the carrier substrate 130 is not completely cut off. In other words, the cutting tool cuts into the middle portion of the carrier substrate 130 and stops. The notch 620 goes through the wafer 600, dam layer 120 and a portion of the carrier substrate 130. The bottom 621 of the notch 620 is at the carrier substrate 130. In some embodiments of the instant disclosure, the wafer 600 does not include test circuit 117, and the first insulation layer 118 is exposed on the side surface 113 of the wafer 600.

Figure 6F:
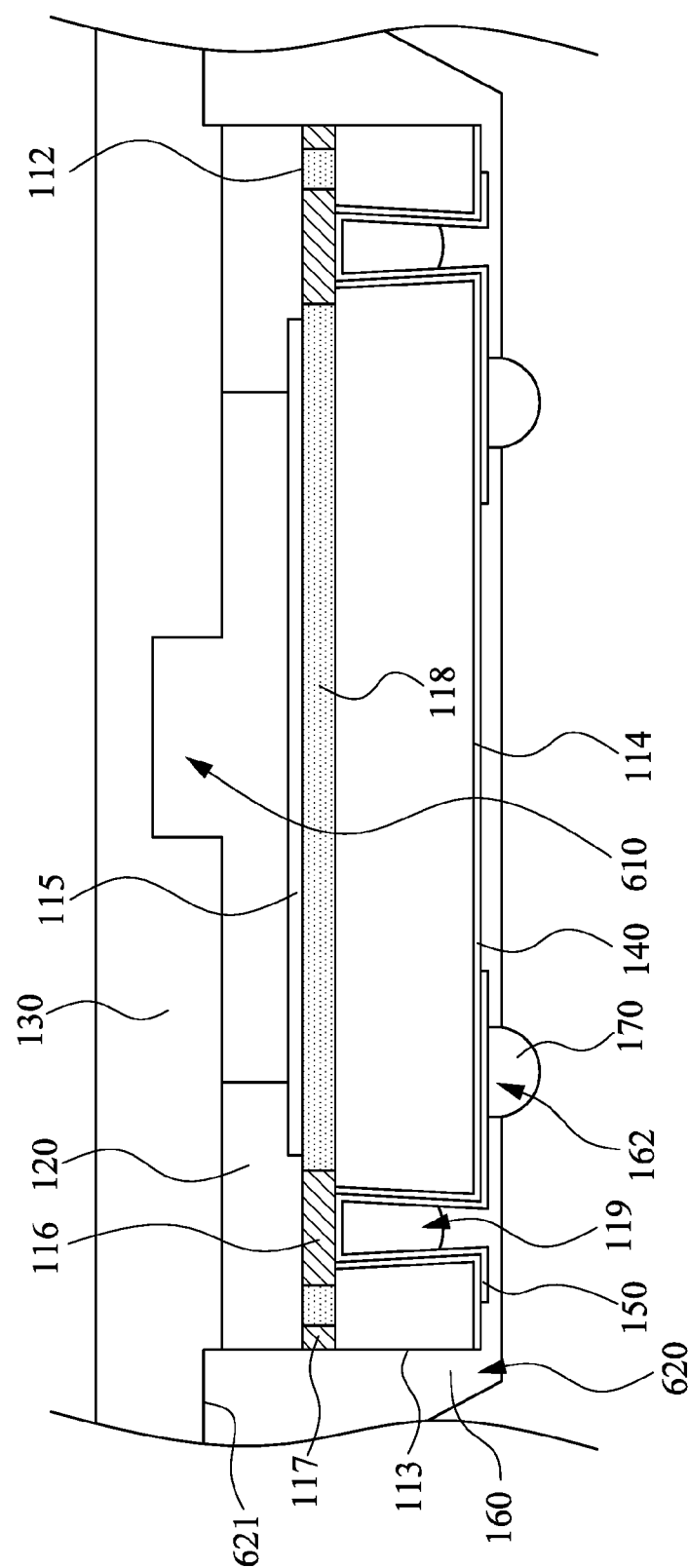

Please refer to step 570 in conjunction with FIG. 6F. A light shielding passivation layer 160 is formed underneath the second surface 114 and in the notch 620. The light shielding passivation layer 160 extends to the carrier substrate 130 and covers the side surface 113 of the wafer 600. The light shielding passivation layer 160 may be formed by spreading, deposition or printing epoxy resin or low light permeability material underneath the conductive layer 150. Before the materials are cured, they show fluidity, and the materials flow into the notch 620 and cover side surface 113 due to gravity, the test circuit 117, side of the dam layer 120 of the wafer 600 and the bottom 621 of the notch 620 at the carrier substrate 130. As a result, a portion of the epoxy resin or low light permeability material is coupled to the carrier substrate 130. Subsequently, heat curing or light crossing is used to cure these materials to form the light shielding passivation layer 160. The light shielding passivation layer 160 that covers side surface 113 protects the test circuit 117 from moisture invasion, and the yield rate is greatly elevated. In some embodiments of the instant disclosure, the wafer 600 does not have test circuit 117, and the light shielding passivation layer 160 covers the first insulation layer 118 exposed on the side surface 113. In some embodiments of the instant disclosure, a portion of the light shielding passivation layer 160 is disposed in the through hole 119 but does not completely fill the through hole 119.

Please refer to step 580 in conjunction with FIG. 6F. A second opening 162 is formed in the light shielding passivation layer 160 to expose the conductive layer 150. Next, an external conductive structure 170 is formed in the second opening 162. In this step, the light shielding passivation layer 160 is patterned to form the second opening 162 that exposes a portion of the conductive layer 150. In some embodiments of the instant disclosure, a material of the light shielding passivation layer is a light sensitive material. More specifically, the light sensitive material is light sensitive epoxy resin or low light permeability light sensitive material. Therefore there is not a need to use additional light mask layer to define the pattern of the light shielding passivation layer 160. The light shielding passivation layer 160 undergoes photolithography to form the second opening 162. Next, the external conductive structure 170 is formed in the second opening 162, and the external conductive structure 170 is in contact with the conductive layer 150 and electrically connected to the conductive layer 150.

Figure 6G:
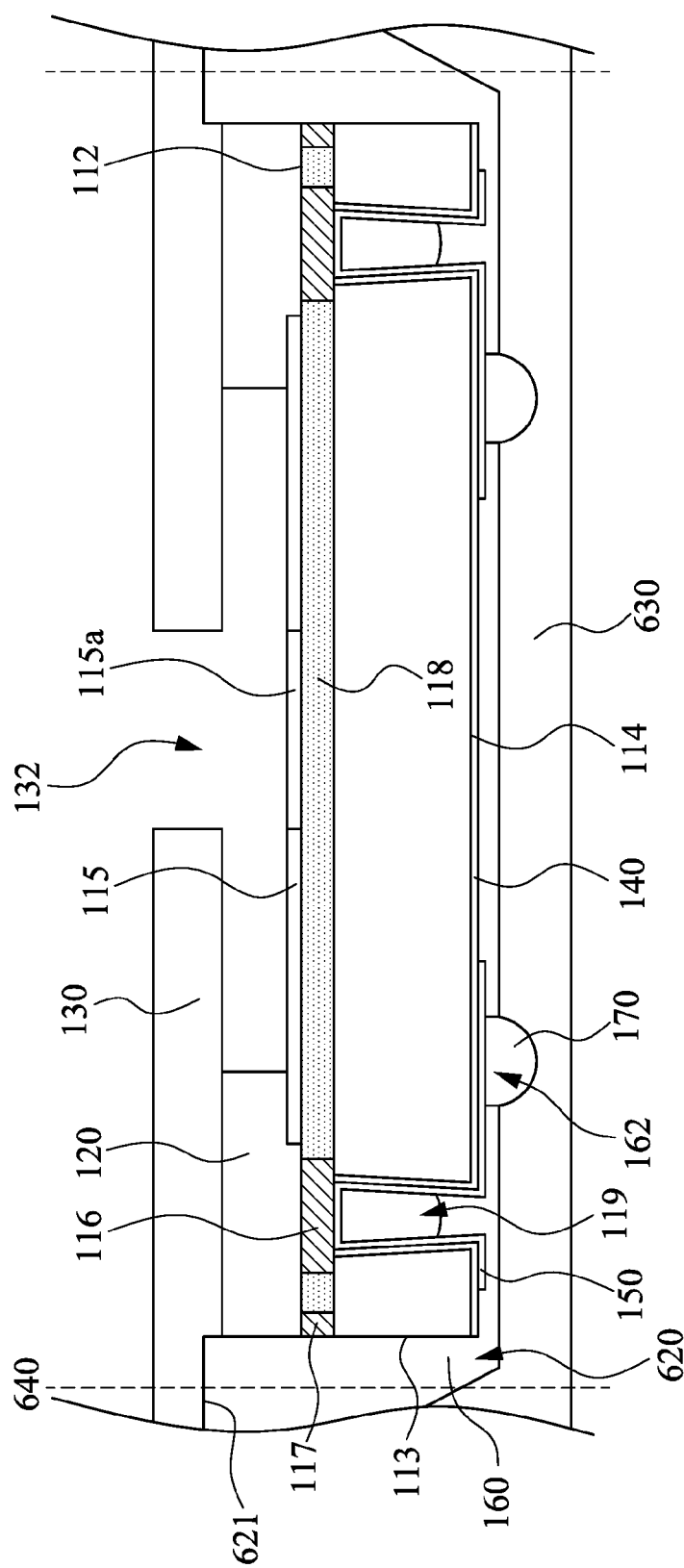

Please refer to step 590 in conjunction with FIG. 6G. A first opening 132 is formed by grinding the carrier substrate 130. The light shielding passivation layer 160 and the carrier substrate 130 are cut along the notch to form a chip package. After the external conductive structure 170 is formed, a temporary adhesive layer 630 is formed to cover the light shielding passivation layer 160 and the external conductive structure 170. Subsequently, the carrier substrate 130 is ground. The grinding process stops at the depression 610 to form the first opening 132 above the sensing layer 115. The vertical projection of the sensing layer 115 over the first opening 132 is the sensing area 115a. In the instant embodiment, the moisture enters through the first opening 132, leading to change of humidity sensing polymer property (e.g., resistance, capacitance) in the sensing area 115a. In some embodiments of the instant disclosure, after the formation of the first opening 132, the carrier substrate 130 may be ground further more to reduce its thickness. Next, the light shielding passivation layer 160, carrier substrate 130 and the temporary adhesive layer 630 are cut along the scribe line 640 at the notch 620 such that chip areas on the wafer 600 are separated. Finally, the temporary adhesive layer 630 is removed to form the chip package 100 shown in FIG. 1. The temporary adhesive layer 630 provides support when the wafer 600 is ground, and the wafer 600 is less likely to break in the grinding process. In some embodiments of the instant disclosure, the temporary adhesive layer 630 is a tape.

Figure 7:
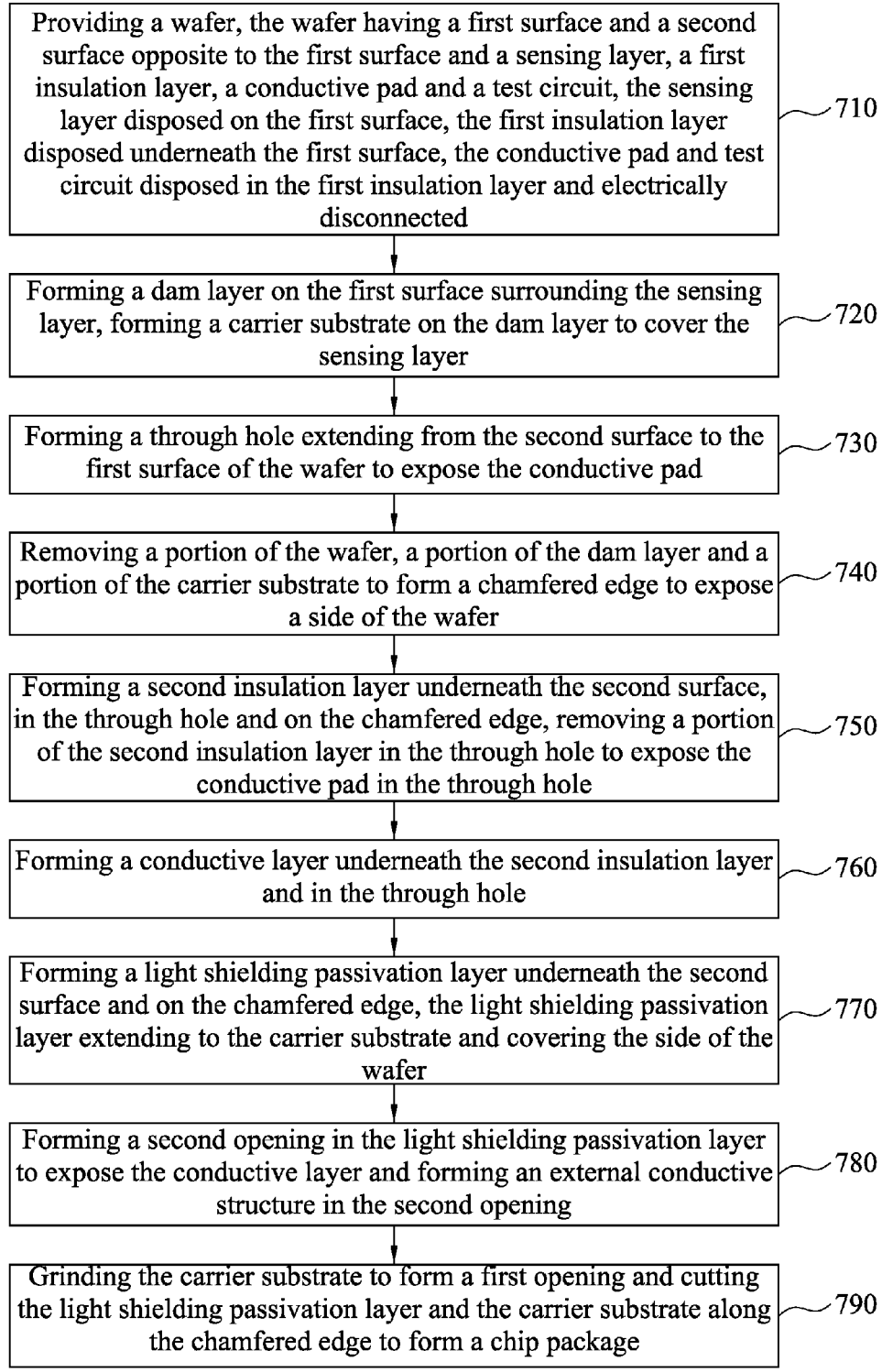
FIG. 7 is a block diagram illustrating a method of manufacturing a chip package in accordance with an embodiment of the instant disclosure.

Pleas refer to FIG. 7. FIG. 7 is a block diagram illustrating a method of manufacturing a chip package in accordance with an embodiment of the instant disclosure. Please refer to FIGS. 8A-8G in conjunction. FIGS. 8A-8G are cross-sectional view illustrating the method of manufacturing the chip package of FIG. 2.

Figure 8A:
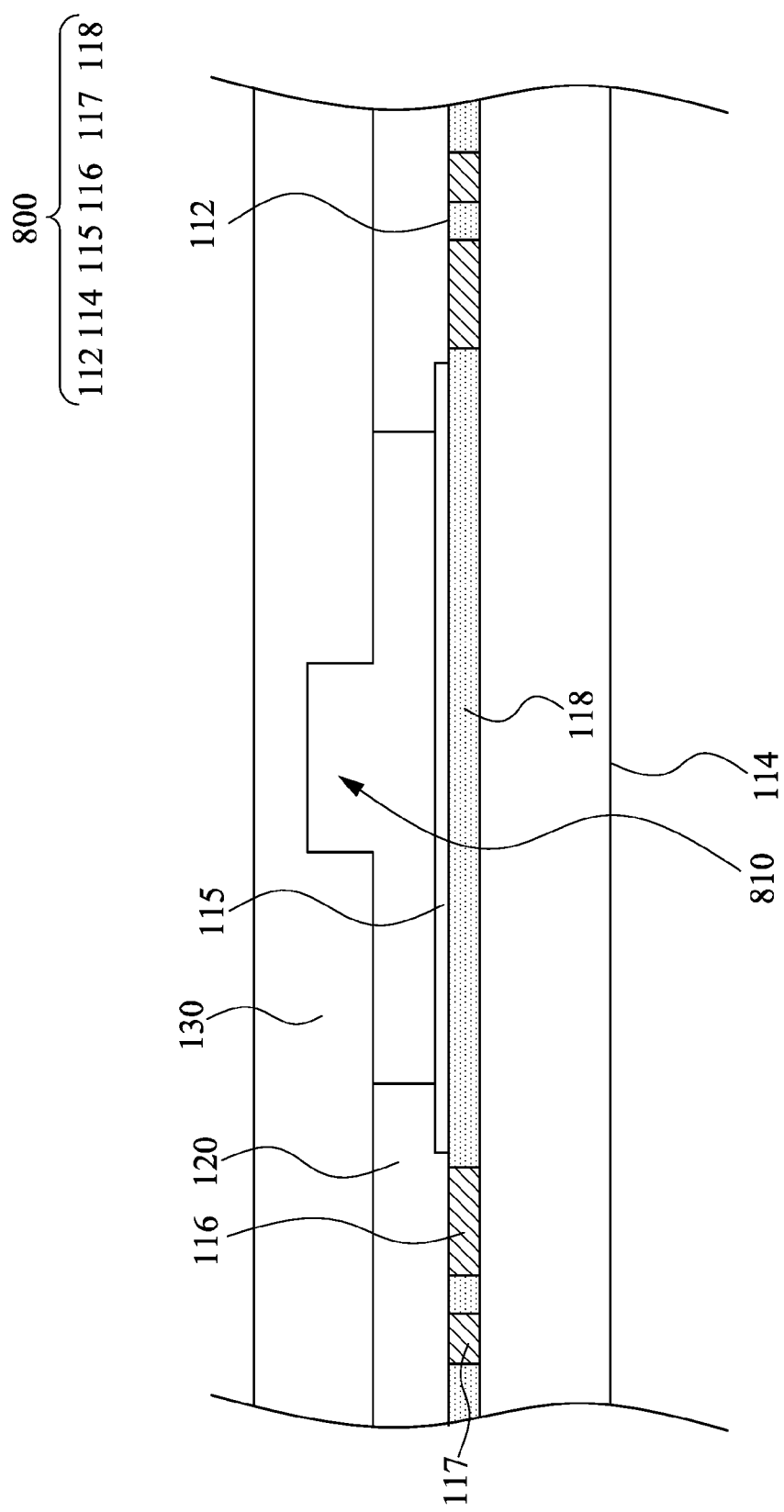
FIGS. 8A-8G are cross-sectional view illustrating the method of manufacturing the chip package of FIG. 2.

Please refer to step 710 in conjunction with FIG. 8A. A wafer 800 is provided. The wafer 800 has a first surface 112 and a second surface 114 opposite to the first surface 112. The wafer 800 has a sensing layer 115, a first insulation layer 118, a conductive pad area 116 and a test circuit 117. The sensing layer 115 is disposed on the first surface 112. The first insulation layer 118 is disposed underneath the first surface 112. The conductive pad area 116 and test circuit 117 are disposed in the first insulation layer 118 and electrically disconnected. The wafer 800 has a plurality of chip areas, and in the subsequent process the chip areas are cut to form a plurality of chip packages 200. In some embodiments of the instant disclosure, the wafer 800 includes semiconductor elements, inter-layered dielectric layer, inter-metal dielectric layer, passivation layer and interconnection metal structure. The conductive pad area 116 and the test circuit 117 are the interconnection metal structure of the wafer 800. They have a plurality of metal layers in parallel and vias connected in between. A portion of the first insulation layer 118 is disposed in between the metal layers, acting as inter-metal dielectric layer. Vias may go through the first insulation layer 118 to electrically connect adjacent metal layers. Furthermore, the first insulation layer 118 allows electrical insulation between the conductive pad area 116 and the test circuit 117.

Please refer to step 720 in conjunction with FIG. 8A. A dam layer 120 is formed on the first surface 112 and surrounds the sensing layer 115. Next, a carrier substrate 120 is formed on the dam layer 120 and covers the sensing layer 115. In this step, an adhesive layer (not shown) is used to combine the sensing layer 115 and the first surface 112. Subsequently, the carrier substrate 130 is attached to the dam layer 120. It should be noted that the carrier substrate 130 is formed with a depression 810 defining the sensing area 115a of the sensing layer 115.

Figure 8B:
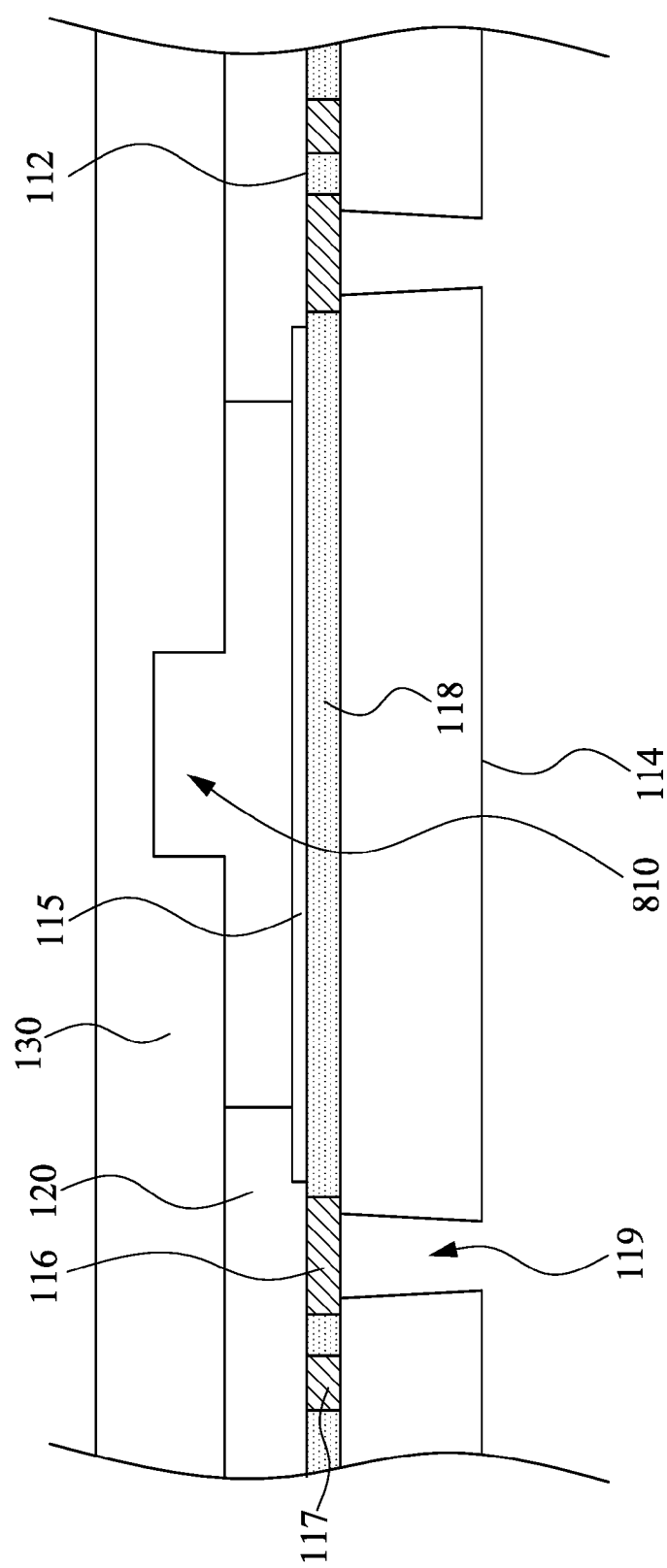

Please refer to step 730 in conjunction with FIG. 8B. A through hole 119 is formed and extending from the second surface 114 to the first surface 112 of the wafer 800 to expose the conductive pad 116. In this step, a portion of the wafer 800 may be removed by photolithography to form the through hole 119 so as to expose the conductive pad area 116. However, the instant disclosure is not limited thereto. In some embodiments of the instant disclosure, before the through hole 119 is formed, the second surface 114 of the wafer 800 is ground so as to reduce the thickness of the wafer 800.

Figure 8C:
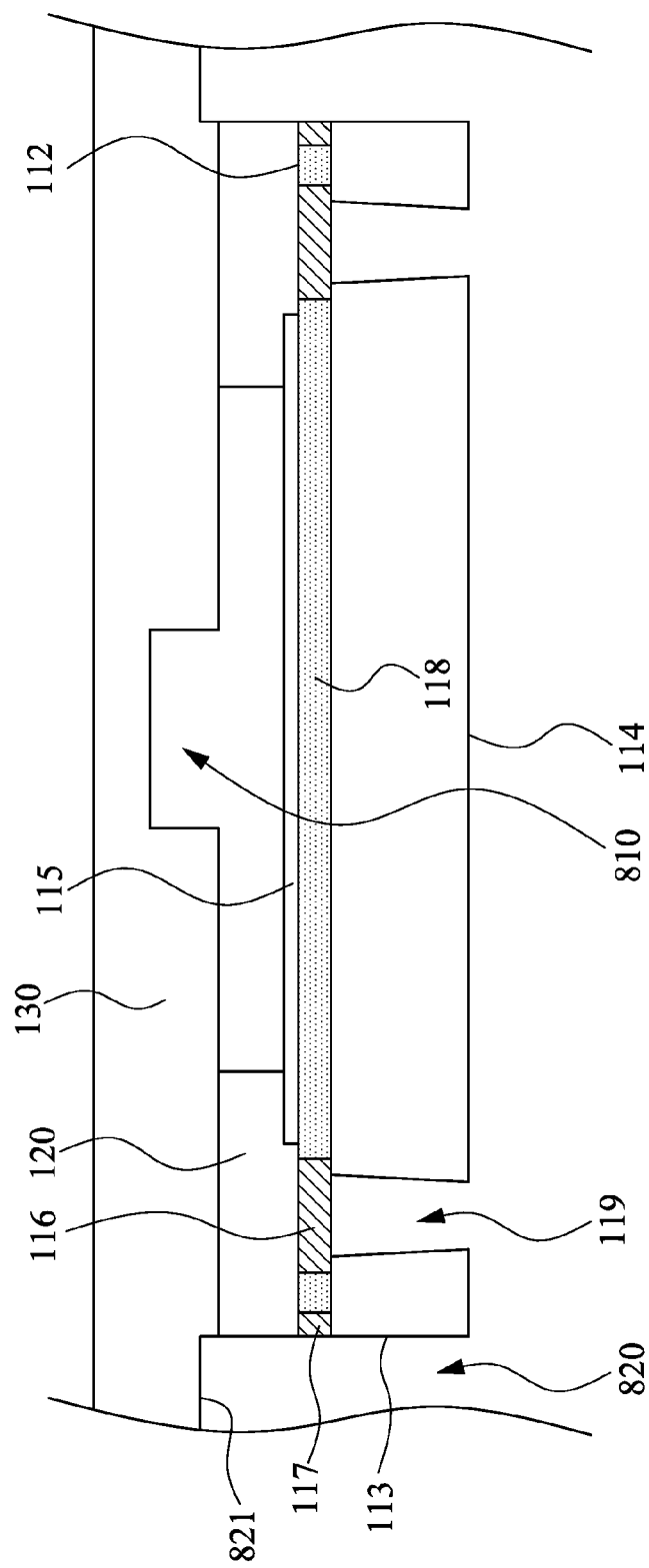

Please refer to step 840 in conjunction with FIG. 8C. A portion of the wafer 800, a portion of the dam layer 120 and a portion of the carrier substrate 130 are removed to form a notch 820 to expose a side surface 113 of the wafer 800. In this step, a cutting tool is used to remove a portion of the wafer 800 to form the side surface 113 in between the first surface 112 and the second surface 114. The test circuit 117 is exposed on the side surface 113 of the wafer 800. It should be noted that this step is a pre-cutting process, the carrier substrate 130 is not completely cut off. In other words, the cutting tool cuts into the middle portion of the carrier substrate 130 and stops. The notch 820 goes through the wafer 800, dam layer 120 and a portion of the carrier substrate 130. The bottom 821 of the notch 820 is at the carrier substrate 130. In some embodiments of the instant disclosure, the wafer 800 does not include test circuit 117, and the first insulation layer 118 is exposed on the side surface 113 of the wafer 800.

Figure 8D:
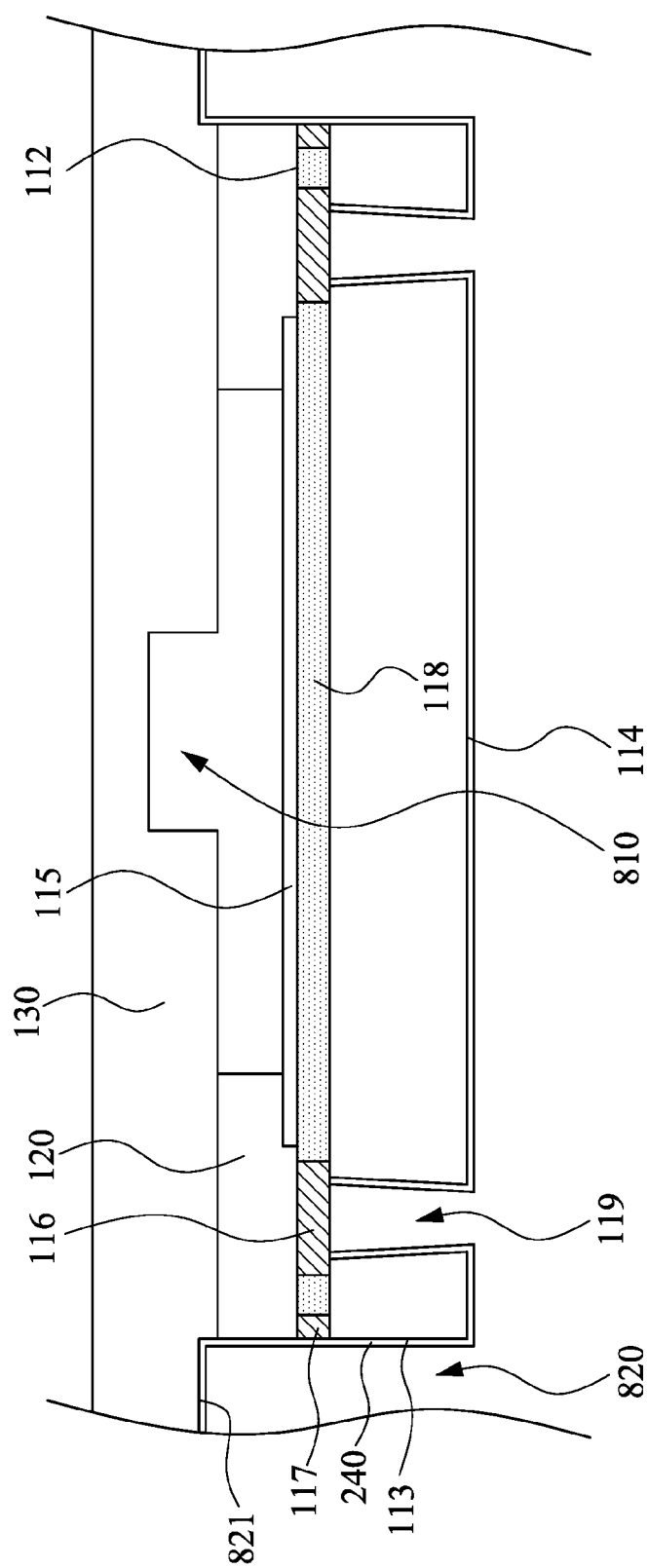

Please refer to FIG. 750 in conjunction with FIG. 8D. A second insulation layer 240 is formed underneath the second surface 114 of the wafer 800 and in the through hole 119. Subsequently, a portion of the second insulation layer 240 is removed from the through hole 119 to expose the conductive pad area 116 in the through hole 119. In this step, chemical vapor deposition (CVD) is used to deposit insulation material underneath the second surface 114 conformingly. A portion of the insulation material enters the through hole 119 and covers the sidewalls and bottom thereof. It should be noted that, the difference between the process shown in FIGS. 8A-8G and FIGS. 6A-6G arise from the notch formation. More specifically, as shown in FIGS. 8A-8G, the notch 820 is formed before the formation of the second insulation layer 240. As a result, the insulation material conformingly covers the side surface 113 of the after and the bottom 821 of the notch 820. The second insulation layer 240 that protects the test circuit 117 is then formed. Then, photolithography may be used to remove the insulation material in the through hole 119 to form the second insulation layer 240, and the conductive pad area 116 is exposed on the bottom of the through hole 119. In some embodiments of the instant disclosure, the wafer 800 does not have test circuit 117, and the second insulation layer 240 covers the first insulation layer 118 that is exposed on the side surface 113.

Figure 8E:
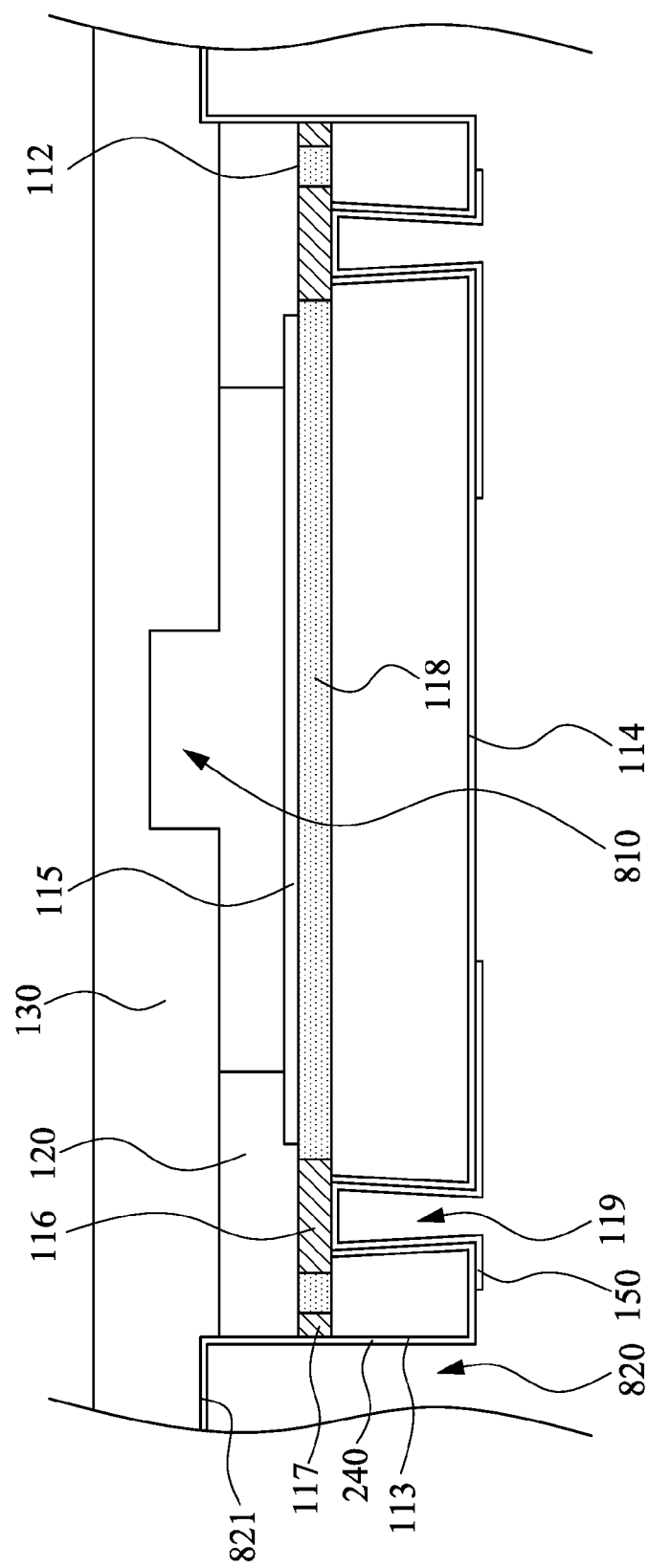

Please refer to step 760 in conjunction with FIG. 8E. A conductive layer 150 is formed underneath the second insulation layer 240 and in the through hole 119. The conductive material may be formed by sputtering, vapor deposition, electroplating, or non-electroplating underneath the second insulation layer 240. A portion of the conductive material extends to the through hole 119 and covers the sidewalls thereof and is in contact with the conductive pad area 116 that is exposed on the bottom of the through hole 119. More specifically, conductive material is in contact with the metal layer in the conductive pad area 116. Afterwards, the conductive material may be patterned by photolithography to form the conductive layer 150. In some embodiments of the instant disclosure, a material of the conductive layer 150 may be, for example, aluminium, copper, nickel or any other suitable conductive material.

Figure 8F:
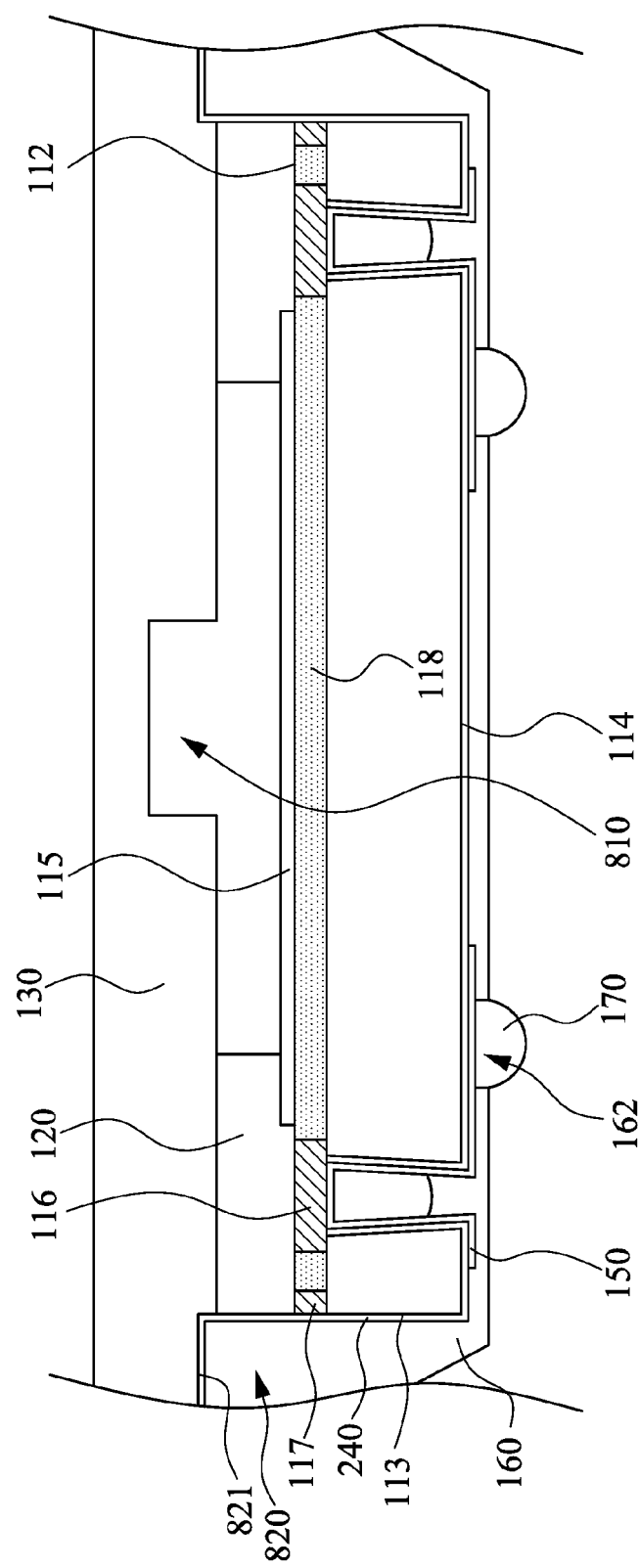

Please refer to step 770 in conjunction with FIG. 8F. A light shielding passivation layer 160 is formed underneath the second surface 114 and in the notch 820. The light shielding passivation layer 160 extends to the carrier substrate 130 and covers the side surface 113 of the wafer 800. The light shielding passivation layer 160 may be formed by spreading, deposition or printing epoxy resin or low light permeability material underneath the conductive layer 150. Before the materials are cured, they shows fluidity, and the materials flow into the notch 820 and cover side surface 113 due to gravity, the test circuit 117, side of the dam layer 120 of the wafer 800 and the bottom 821 of the notch 820 at the carrier substrate 130. As a result, a portion of the epoxy resin or low light permeability material is coupled to the carrier substrate 130. Subsequently, heat curing or light crossing is used to cure these materials to form the light shielding passivation layer 160. The light shielding passivation layer 160 that covers side surface 113 protects the test circuit 117 from moisture invasion, and the yield rate is greatly elevated. In some embodiments of the instant disclosure, the wafer 800 does not have test circuit 117, and the light shielding passivation layer 160 covers the first insulation layer 118 exposed on the side surface 113. In some embodiments of the instant disclosure, a portion of the light shielding passivation layer 160 is disposed in the through hole 119 but does not completely fill the through hole 119.

Please refer to step 780 in conjunction with FIG. 8F. A second opening 162 is formed in the light shielding passivation layer 160 to expose the conductive layer 150. Next, an external conductive structure 170 is formed in the second opening 162. In this step, the light shielding passivation layer 160 is patterned to form the second opening 162 that exposes a portion of the conductive layer 150. In some embodiments of the instant disclosure, a material of the light shielding passivation layer is a light sensitive material. More specifically, the light sensitive material is light sensitive epoxy resin or low light permeability light sensitive material. Therefore there is not a need to use additional light mask layer to define the pattern of the light shielding passivation layer 160. The light shielding passivation layer 160 may undergo photolithography so as to form the second opening 162. Next, the external conductive structure 170 is formed in the second opening 162, and the external conductive structure 170 is in contact with the conductive layer 150 and electrically connected to the conductive layer 150.

Figure 8G:
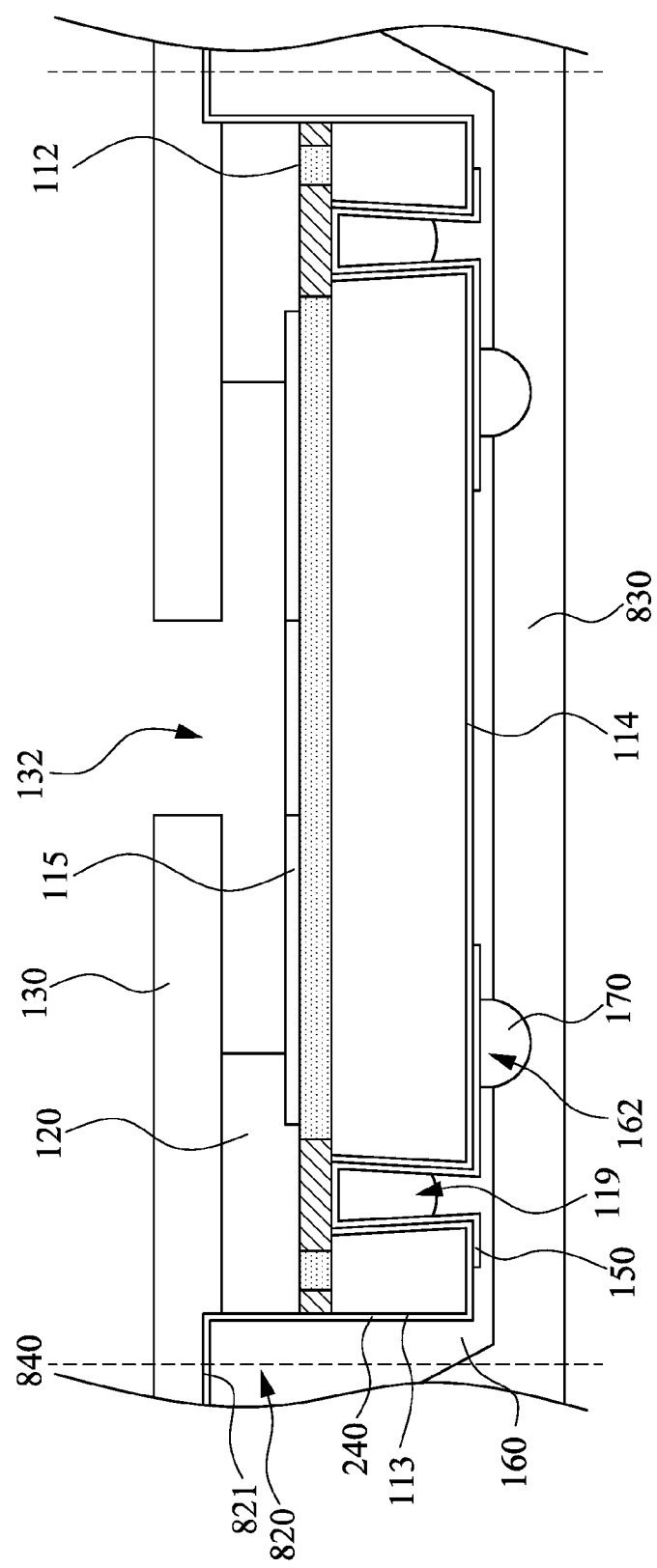

Please refer to step 790 in conjunction with FIG. 8G. A first opening 132 is formed by grinding the carrier substrate 130. The light shielding passivation layer 160, the second insulation layer 240 and the carrier substrate 130 are cut along the notch to form a chip package. After the external conductive structure 170 is formed, a temporary adhesive layer 830 is formed to cover the light shielding passivation layer 160 and the external conductive structure 170. Subsequently, the carrier substrate 130 is ground. The grinding process stops at the depression 810 to form the first opening 132 above the sensing layer 115. The vertical projection of the sensing layer 115 over the first opening 132 is the sensing area 115a. Next, the light shielding passivation layer 160, second insulation layer 240 and carrier substrate 130 are cut along the scribe line 840 at the notch 820 such that chip areas on the wafer 800 are separated. Finally, the temporary adhesive layer 830 is removed to form the chip package 200 shown in FIG. 2.

Please refer to FIGS. 9A-9G illustrating a method of manufacturing a chip package in accordance with an embodiment of the instant disclosure. FIGS. 9A-9G are cross-sectional view illustrating the method of manufacturing the chip package shown in FIG. 4.

Figure 9A:
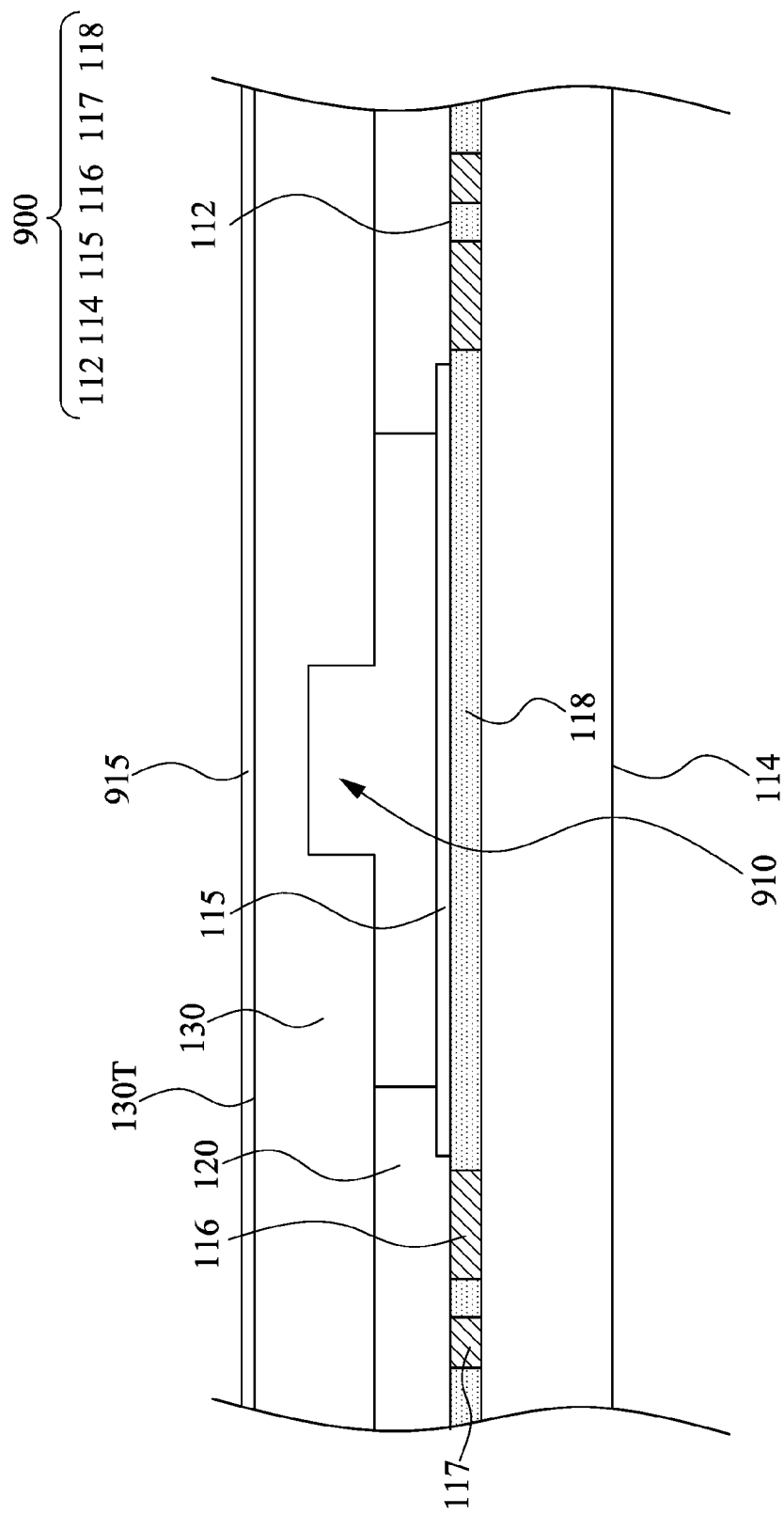
FIGS. 9A-9G are cross-sectional view illustrating the method of manufacturing the chip package of FIG. 4.

Please refer to FIG. 9A. A wafer 900 is provided. The wafer 900 has a first surface 112 and a second surface 114 opposite to the first surface 112. The wafer 900 has a sensing layer 115, a first insulation layer 118, a conductive pad area 116 and a test circuit 117. The sensing layer 115 is disposed on the first surface 112. The first insulation layer 118 is disposed underneath the first surface 112. The conductive pad area 116 and test circuit 117 are disposed in the first insulation layer 118 and electrically disconnected. More details of the wafer 900 can refer to wafer 600 and wafer 800 as previously described.

Please still refer to FIG. 9A. A dam layer 120 is formed on the first surface 112 and surrounds the sensing layer 115. Next, a carrier substrate 120 is formed on the dam layer 120 and covers the sensing layer 115. In this step, an adhesive layer (not shown) is used to combine the sensing layer 115 and the first surface 112. Subsequently, the carrier substrate 130 is attached to the dam layer 120. It should be noted that the carrier substrate 130 is formed with a depression 910 defining the sensing area 115a of the sensing layer 115. It will be elaborated later in the description. After the formation of carrier substrate 130, a temporary carrier layer 915 is formed and covering the upper surface 130T of the carrier substrate 130. The temporary carrier layer 915 can be used as light shielding passivation layer in the following process, and it will be elaborated later. In some embodiments of the instant disclosure, the temporary carrier layer 915 may be tape, glass, sapphire substrate or any other material that can provide support, and the instant disclosure is not limited thereto.

Figure 9B:
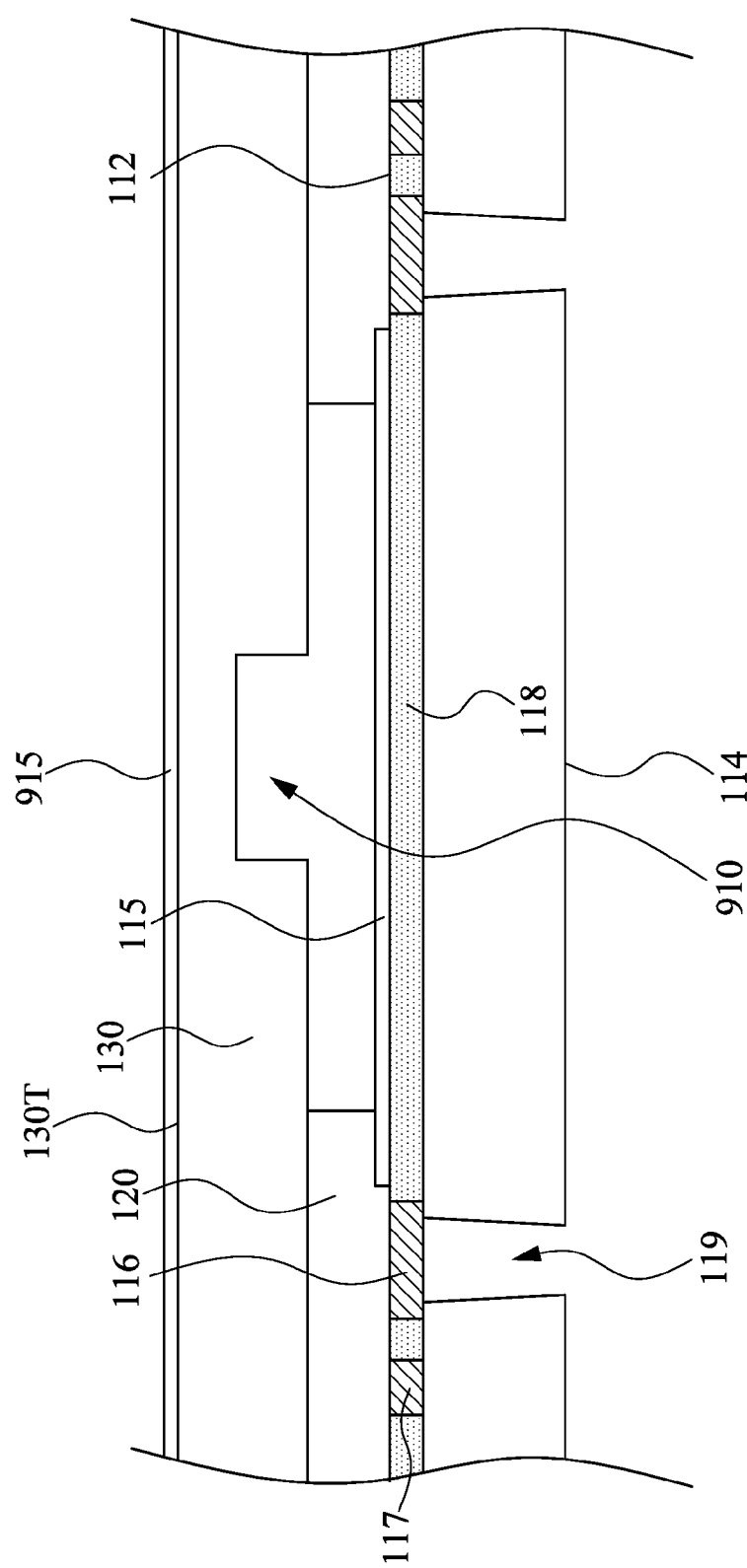

Please refer to FIG. 9B. A through hole 119 is formed and extending from the second surface 114 to the first surface 112 of the wafer 900 to expose the conductive pad 116. In this step, a portion of the wafer 900 may be removed by photolithography to form the through hole 119 so as to expose the conductive pad area 116. However, the instant disclosure is not limited thereto. In some embodiments of the instant disclosure, before the through hole 119 is formed, the second surface 114 of the wafer 900 is ground so as to reduce the thickness of the wafer 900.

Figure 9C:
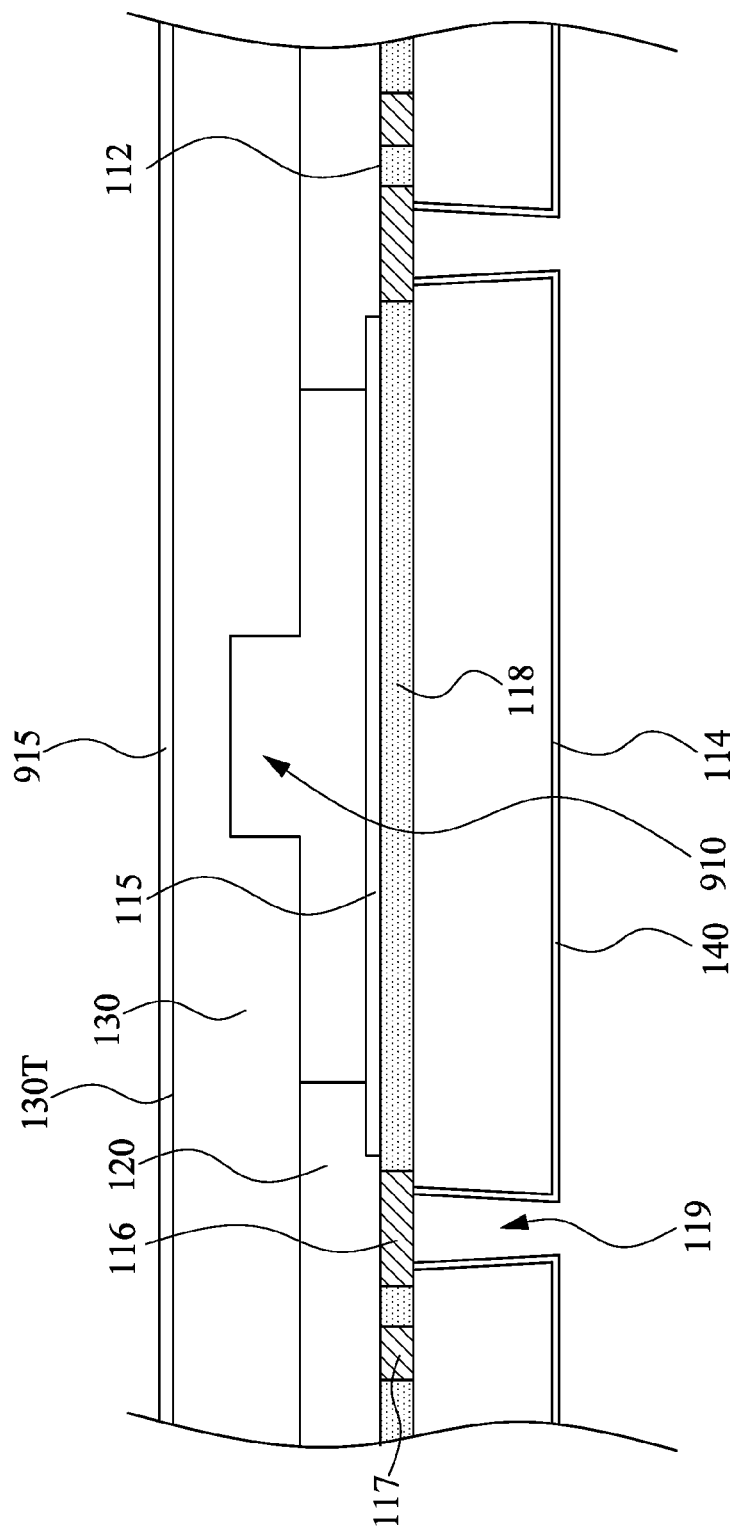

Please refer to FIG. 9C. A second insulation layer 140 is formed underneath the second surface 114 of the wafer 900 and in the through hole 119. Subsequently, a portion of the second insulation layer 140 is removed from the through hole 119 to expose the conductive pad area 116 in the through hole 119. In this step, chemical vapor deposition (CVD) is used to deposit insulation material underneath the second surface 114 conformingly. A portion of the insulation material enters the through hole 119 and covers the sidewalls and bottom thereof. Then, photolithography may be used to remove the insulation material in the through hole 119 to form the second insulation layer 140, and the conductive pad area 116 is exposed on the bottom of the through hole 119.

Figure 9D:
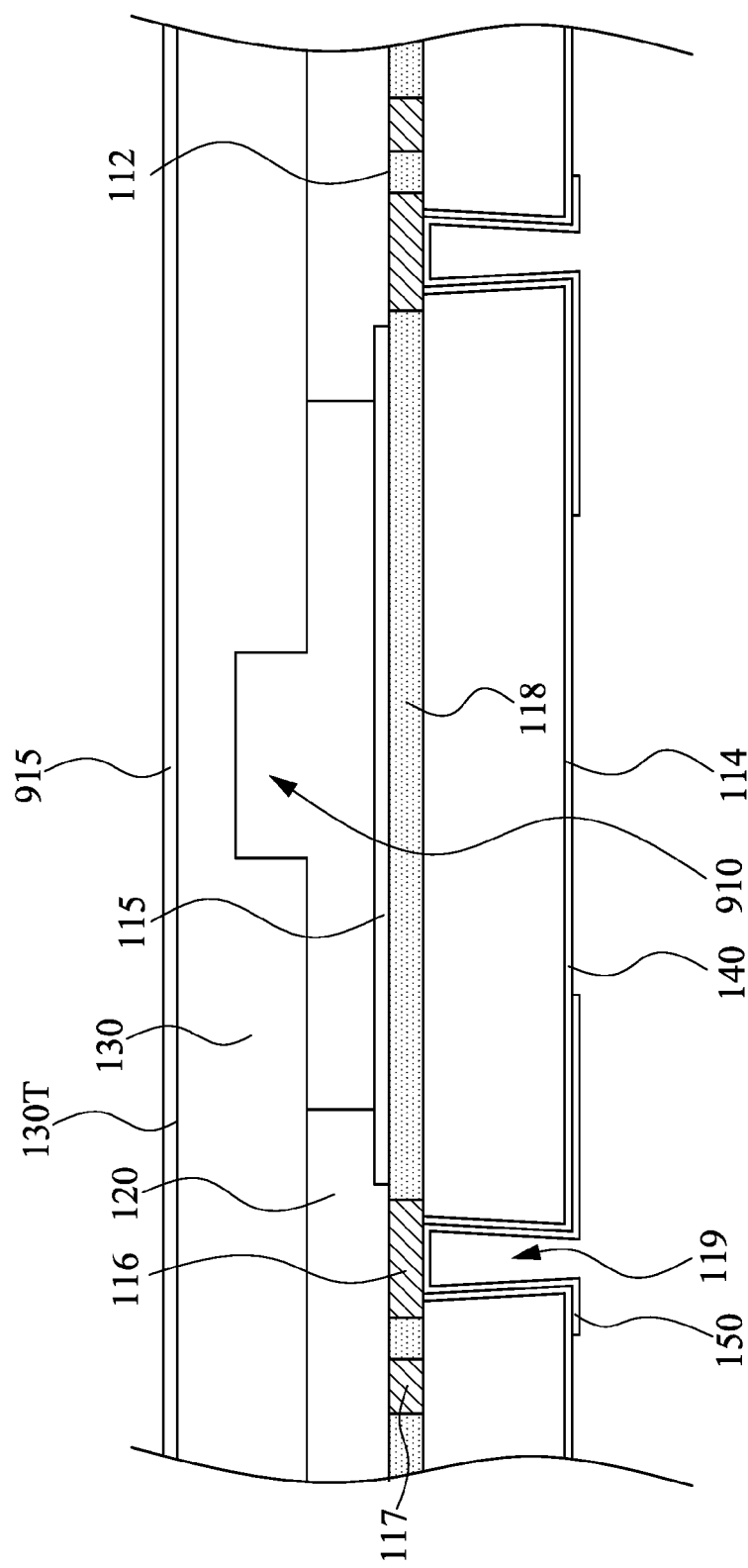

Please refer to FIG. 9D. A conductive layer 150 is formed underneath the second insulation layer 140 and in the through hole 119. The conductive material may be formed by sputtering, vapor deposition, electroplating, or non-electroplating underneath the second insulation layer 140. A portion of the conductive material extends to the through hole 119 and covers the sidewalls thereof and is in contact with the conductive pad area 116 that is exposed on the bottom of the through hole 119. More specifically, conductive material is in contact with the metal layer in the conductive pad area 116. Afterwards, the conductive material may be patterned by photolithography to form the conductive layer 150.

Figure 9E:
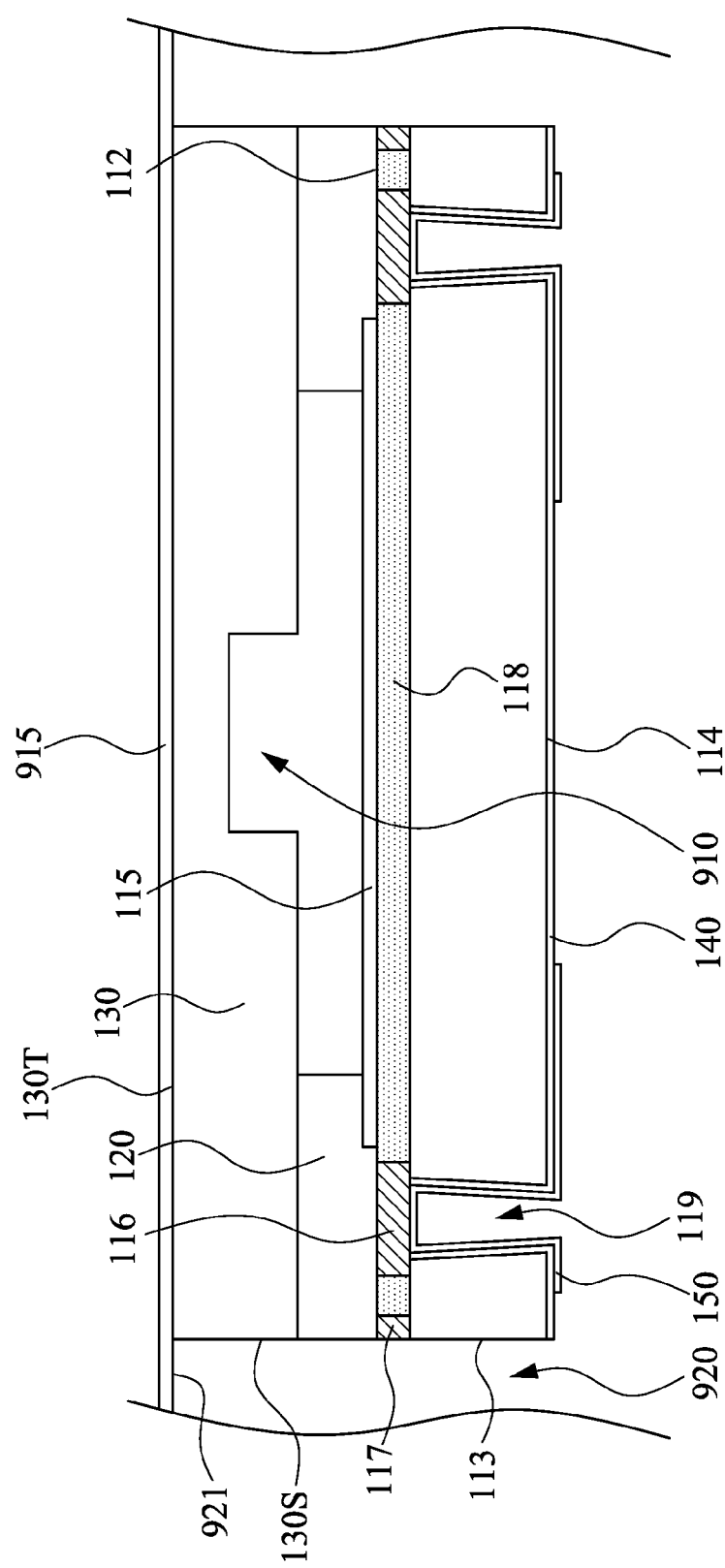

Please refer to FIG. 9E. A portion of the wafer 900, a portion of the dam layer 120 and a portion of the carrier substrate 130 are removed to form a notch 920 to expose a side surface 113 of the wafer 800. In this step, a cutting tool is used to remove a portion of the wafer 900 to form the side surface 113 in between the first surface 112 and the second surface 114. The test circuit 117 is exposed on the side surface 113 of the wafer 900. The difference between the cutting shown in FIGS. 9E and 6E arises from the carrier substrate 130. In FIG. 9E, the carrier substrate 130 is completely cut off. In other words, this pre-cutting process goes through the carrier substrate 130 and stops at the temporary carrier layer 915. As a result, the notch 920 goes through the wafer 900, dam layer 120 and the carrier substrate 130. The temporary carrier layer 915 is exposed from the bottom 921 of the notch 920. In some embodiments of the instant disclosure, the wafer 900 does not include test circuit 117, and the first insulation layer 118 is exposed on the side surface 113 of the wafer 900.

Figure 9F:
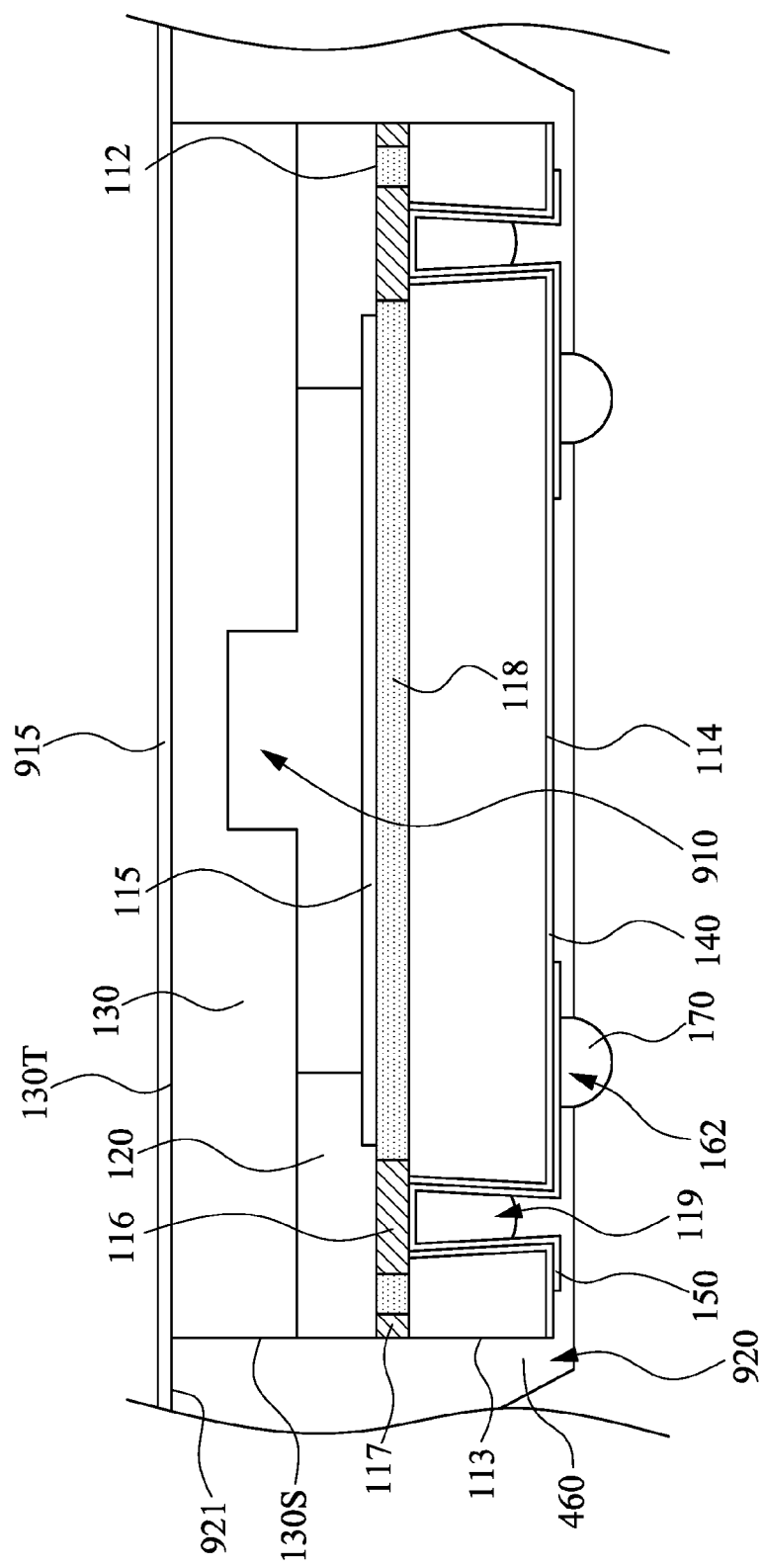

Please refer to FIG. 9F. A light shielding passivation layer 460 is formed underneath the second surface 114 and in the notch 920. The light shielding passivation layer 460 extends and covers the side surface 113 of the wafer 900 and the side surface 130S of the carrier substrate 130. The formation of the light shielding passivation layer 460 can be referred back the light shielding passivation layer 160 as described in FIG. 6F. To avoid redundancy, it is not reaped herein. As previously described, before the materials are cured, the light shielding passivation layer 460 shows fluidity, and the materials flow into the notch 920 and cover side surface 113 and side surface 130S of the carrier substrate 130. The temporary carrier layer 915 acts as a bar to prevent the material from dropping, and the materials are retained in the notch 920. The light shielding passivation layer 460 prevents test circuit 117 from moisture damage and completely shield any light inlet from the side surface 130S of the carrier substrate 130 such that the yield rate is greatly elevated and detection precision is higher. In some embodiments of the instant disclosure, the wafer 900 does not have test circuit 117, and the light shielding passivation layer 460 covers the first insulation layer 118 exposed on the side surface 113.

Please refer to FIG. 9F. A second opening 162 is formed in the light shielding passivation layer 460 to expose the conductive layer 150. Next, an external conductive structure 170 is formed in the second opening 162. In this step, the light shielding passivation layer 460 is patterned to form the second opening 162 that exposes a portion of the conductive layer 150 from the second opening 162. In some embodiments of the instant disclosure, a material of the light shielding passivation layer 460 is a light sensitive material. More specifically, the light sensitive material is light sensitive epoxy resin or low light permeability light sensitive material. Therefore there is not a need to use additional light mask layer to define the pattern of the light shielding passivation layer 460. The light shielding passivation layer 460 undergoes photolithography is patterned to form the second opening 162. Next, the external conductive structure 170 is formed in the second opening 162, and the external conductive structure 170 is in contact with the conductive layer 150 and electrically connected to the conductive layer 150.

Figure 9G:
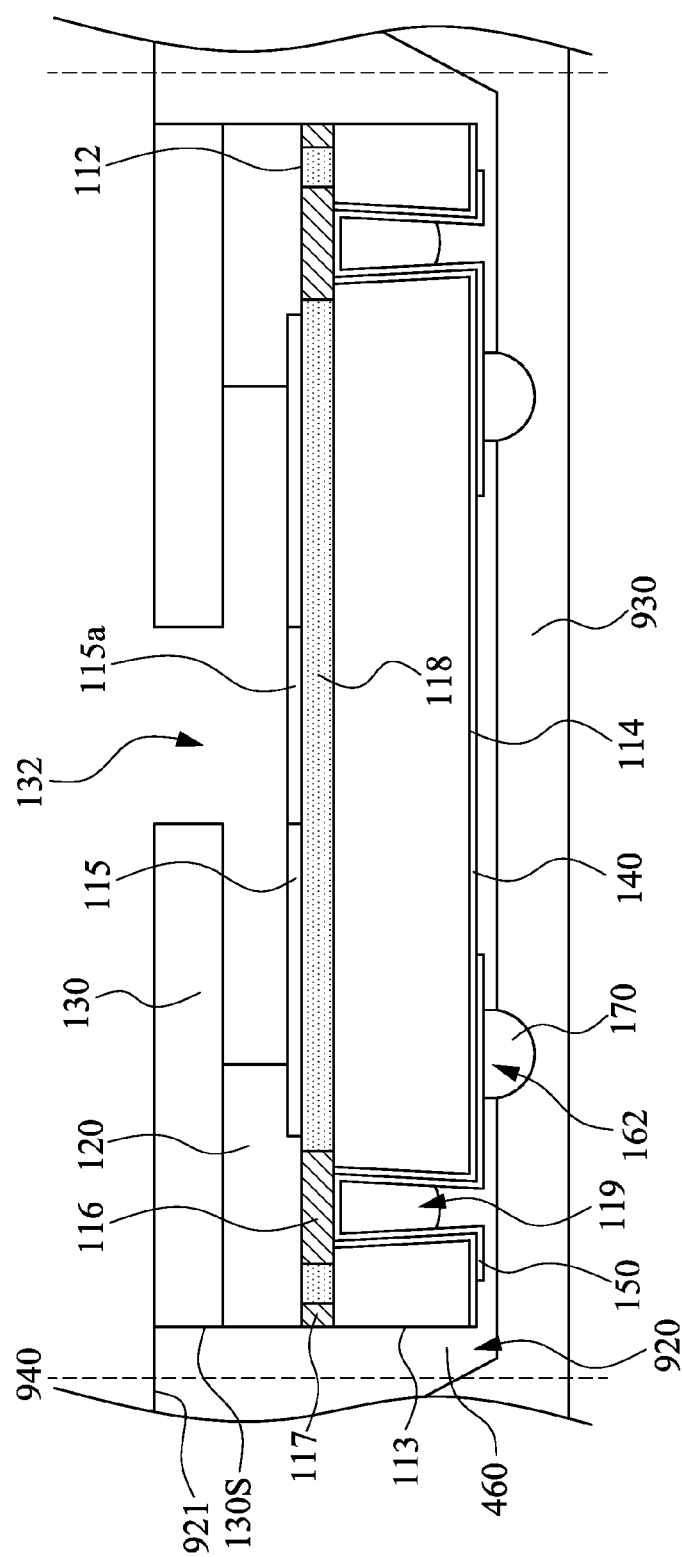

Finally please refer to FIG. 9G. The temporary carrier layer 915 is removed, and a first opening 132 is formed by grinding the carrier substrate 130. The light shielding passivation layer 460 is cut along the notch 920 to form a chip package. After the external conductive structure 170 is formed, a temporary adhesive layer 930 is formed to cover the light shielding passivation layer 460 and the external conductive structure 170. Subsequently, the carrier substrate 130 is ground. The grinding process stops at the depression 910 to form the first opening 132 above the sensing layer 115. The vertical projection of the sensing layer 115 over the first opening 132 is the sensing area 115a. In some embodiments of the instant disclosure, the temporary carrier layer 915 may be removed by grinding. Next, the first opening 132 is formed by further grinding the carrier substrate 130. The thickness of the carrier substrate 130 may be reduced by grinding the carrier substrate 130 after the formation of the first opening 132. Next, the light shielding passivation layer 460 and the temporary adhesive layer 930 are cut along the scribe line 940 at the notch 920 such that chip areas on the wafer 900 are separated. Finally, the temporary adhesive layer 930 is removed to form the chip package 400 shown in FIG. 4. The temporary adhesive layer 930 provides a support upon grinding, such that the wafer 900 is less likely to break by the stress in the cutting process. In some embodiments of the instant disclosure, the temporary adhesive layer 930 is a tape.

The light shielding passivation layer of the chip package of the instant disclosure extends to the side surface of the chip and covers the exposed test circuit or the first insulation layer so as to block moisture entry. As a result, the test circuit or the first insulation layer is not interfered by moisture which will lead to oxidation. The internal circuit in the chip package, for example, silicon vias, can maintain good conductivity. In addition, the light shielding passivation layer covers the side surface of the dam layer such that the dam layer does not absorb moisture which leads to peeling off from the chip. In other embodiments, the second insulation layer of the chip package extends to the side surface of the chip and is disposed in between the light shielding layer and the side surface. The second insulation layer that has solid built structure further isolates the side surface of the chip from moisture. In some embodiments of the instant disclosure, the light shielding passivation layer completely covers the side surface of the carrier substrate so as to prevent light entry from the side surface and reduce interference. In short, the chip package and method of manufacturing the same can effectively block moisture in the ambience from entering the chip package, and the yield rate and reliability are greatly elevated.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A chip package, comprising:
 a chip comprising:
  a first surface,
  a second surface opposite to the first surface,
  a side surface in between the first surface and the second surface,
  a first insulation layer, disposed underneath the first surface,
  a sensing layer, disposed on the first surface,
  a conductive pad area and a test circuit disposed in the first insulation layer, wherein the conductive pad area and the test circuit being not electrically connected directly, and at least a part of the test circuit is exposed on the side surface of the chip, and
  a through hole extending from the second surface towards the first surface of the chip to expose the conductive pad area;
 a dam layer disposed on the first surface and surrounding the sensing layer;
 a carrier substrate disposed on the dam layer; and
 a light shielding passivation layer disposed underneath the second surface of the chip, the light shielding passivation layer extending to the carrier substrate and covering on the side surface of the chip, the exposed part of the test circuit and a side surface of the dam layer.

2. The chip package of claim 1, wherein a material of the light shielding passivation layer includes epoxy resin or a low light permeability material.

3. The chip package of claim 1, wherein the first insulation layer is exposed on the side surface of the chip, and the light shielding passivation layer covers the first insulation layer.

4. The chip package of claim 1, wherein the carrier substrate is formed with a first opening on the sensing layer.

5. The chip package of claim 1, further comprising:
 a second insulation layer disposed underneath the second surface and extending into the through hole, covering sidewalls of the through hole; and
 a conductive layer disposed in between the second insulation layer and the light shielding passivation layer and extending into the through hole and in contact with the area of the conductive pads.

6. The chip package of claim 5, wherein a material of the first insulation layer and the second insulation layer includes silicon oxide, silicon nitride, silicon oxynitride or a combination thereof.

7. The chip package of claim 5, wherein the second insulation layer extends and covers the side surface and is in between the side surface of the chip and the light shielding passivation layer.

8. The chip package of claim 5, wherein the light shielding passivation layer is formed with a second opening to expose a portion of the conductive layer.

9. The chip package of claim 8, further comprising an external conductive structure disposed in the second opening and in contact with the conductive layer.

10. A method of manufacturing a chip package, comprising:
 providing a wafer, the wafer comprising a first surface and a second surface opposite to the first surface, a sensing layer disposed on the first surface, a first insulation layer disposed underneath the first surface, and a conductive pad area and a test circuit disposed in the first insulation layer, wherein the conductive pad area and the test circuit are not electrically connected directly;
 forming a dam layer on the first surface, wherein the dam layer surrounds the sensing layer;
 forming a through hole extending from the second surface to the first surface of the wafer to expose the conductive pad area;
 forming a carrier substrate on the dam layer;
 removing a portion of the wafer, a portion of the dam layer and a portion of the carrier substrate to form a notch to expose a side surface in between the first surface and the second surface of the wafer, wherein at least a part of the test circuit is exposed on the side surface of the wafer; and
 forming a light shielding passivation layer underneath the second surface and in the notch, the light shielding passivation layer extending to the carrier substrate and covering the exposed part of the test circuit, the side surface of the wafer and a side surface of the dam layer.

11. The method of manufacturing a chip package according to claim 10, further comprising grinding the second surface of the wafer.

12. The method of manufacturing a chip package according to claim 10, further comprising:
 forming a second insulation layer underneath the second surface and in the through hole;
 removing a portion of the second insulation layer in the through hole to expose the conductive pad in the through hole; and
 forming a conductive layer underneath the second insulation layer and in the through hole, wherein the light shielding passivation layer covers the conductive layer.

13. The method of manufacturing a chip package according to claim 12, further comprising:
 patterning the light shielding passivation layer to form a second opening that exposes the conductive layer; and
 forming an external conductive structure in the second opening.

14. The method of manufacturing a chip package according to claim 13, further comprising:
 grinding the carrier substrate to form a first opening.

15. The method of manufacturing a chip package according to claim 14, further comprising:
 cutting the light shielding passivation layer along the notch to form a chip package.

16. The method of manufacturing a chip package according to claim 10, wherein the light shielding passivation layer is formed by spreading, deposition or printing.

* * * * *